US011527588B2

(12) United States Patent
Choi et al.

(10) Patent No.: US 11,527,588 B2
(45) Date of Patent: Dec. 13, 2022

(54) DISPLAY APPARATUS HAVING AN EVEN PATTERN LAYER COMPRISING A PLURALITY OF PROTRUSIONS AND GROOVES ARRANGED ON A SUBSTRATE AND MANUFACTURING METHOD THEREOF

(71) Applicant: Samsung Display Co., Ltd., Yongin-si (KR)

(72) Inventors: Jungmin Choi, Yongin-si (KR); Eonseok Oh, Yongin-si (KR); Woosik Jeon, Yongin-si (KR); Sangyeol Kim, Yongin-si (KR); Hyungsik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 16/990,158

(22) Filed: Aug. 11, 2020

(65) Prior Publication Data

US 2021/0111231 A1 Apr. 15, 2021

(30) Foreign Application Priority Data

Oct. 14, 2019 (KR) .......................... 10-2019-0127161

(51) Int. Cl.
*H01L 27/32* (2006.01)
*H01L 51/52* (2006.01)
*G02B 5/30* (2006.01)

(52) U.S. Cl.
CPC ...... *H01L 27/3244* (2013.01); *H01L 51/5253* (2013.01); *G02B 5/3016* (2013.01); *H01L 2227/323* (2013.01)

(58) Field of Classification Search
CPC ............ H01L 27/3246; H01L 51/5253; H01L 27/3244
USPC ........................................................... 257/40
See application file for complete search history.

(56) References Cited

U.S. PATENT DOCUMENTS

| 2010/0051178 A1 | 3/2010 | Lee et al. |
| 2017/0148856 A1* | 5/2017 | Choi ................... H01L 27/3258 |
| 2018/0183015 A1 | 6/2018 | Yun et al. |
| 2019/0074479 A1 | 3/2019 | Lee et al. |

FOREIGN PATENT DOCUMENTS

| EP | 3 486 962 A2 | 5/2019 |
| KR | 10-2006-0080827 A | 7/2006 |
| KR | 10-2010-0027526 A | 3/2010 |
| KR | 10-1521693 B1 | 5/2015 |

* cited by examiner

*Primary Examiner* — Hoai V Pham
(74) *Attorney, Agent, or Firm* — Lewis Roca Rothgerber Christie LLP

(57) ABSTRACT

A display apparatus includes a display area and a transmission area on a substrate, and an intermediate area arranged between the display area and the transmission area and including a first sub-intermediate area and a second sub-intermediate area between the first sub-intermediate area and the transmission area, and a number of layers of thin films stacked on the substrate in the first sub-intermediate area is different from a number of layers of thin films stacked on the substrate in the second sub-intermediate area.

20 Claims, 30 Drawing Sheets

DISPLAY APPARATUS HAVING AN EVEN PATTERN LAYER COMPRISING A PLURALITY OF PROTRUSIONS AND GROOVES ARRANGED ON A SUBSTRATE AND MANUFACTURING METHOD THEREOF

CROSS-REFERENCE TO RELATED APPLICATION

This application claims priority to and the benefit of Korean Patent Application No. 10-2019-0127161, filed on Oct. 14, 2019 in the Korean Intellectual Property Office, the entire disclosure of which is incorporated herein by reference.

BACKGROUND

1. Field

Aspects of one or more embodiments relate to a display apparatus and a manufacturing method of the display apparatus.

2. Description of Related Art

The usage of display apparatuses is diversifying. In addition, the thickness and the weight of the display apparatuses are decreasing, and the range of use thereof is widening.

Various functions for connecting or linking to display apparatuses have been added, while the area occupied by a display area in such display apparatuses has increased. As a method of adding various functions while enlarging the area, research into a display apparatus capable of arranging various components in a display area has been conducted.

SUMMARY

According to aspects of one or more embodiments, a display apparatus having a transmission area inside a display area, and a manufacturing method of the display apparatus, are provided. According to an aspect of one or more embodiments, a display panel having a transmission area in which various kinds of components may be arranged in a display area, and a display apparatus including the display panel, are provided. However, these are merely provided as an example, and the scope of the disclosure is not limited thereto.

Additional aspects will be set forth, in part, in the description which follows and, in part, will be apparent from the description, or may be learned by practice of the presented embodiments of the disclosure.

According to one or more embodiments, a display apparatus includes a display area and a transmission area on a substrate, and an intermediate area arranged between the display area and the transmission area and including a first sub-intermediate area and a second sub-intermediate area between the first sub-intermediate area and the transmission area, wherein a number of layers of thin films stacked on the substrate in the first sub-intermediate area is different from a number of layers of thin films stacked on the substrate in the second sub-intermediate area.

The number of layers of thin films stacked on the substrate in the second sub-intermediate area may be less than the number of layers of thin films stacked on the substrate in the first sub-intermediate area.

The display apparatus may further include an uneven pattern layer including a plurality of protrusions and grooves arranged on the substrate in the second sub-intermediate area.

The uneven pattern layer may include polysilicon.

The display area may include a thin-film transistor including a semiconductor layer, a gate electrode, a source electrode, and a drain electrode. The uneven pattern layer may include a same material and be arranged in a same layer as the semiconductor layer.

The display area may further include a display element including a pixel electrode connected to the thin-film transistor, an opposite electrode opposite the pixel electrode, and an intermediate layer between the pixel electrode and the opposite electrode.

The uneven pattern layer may include any of SiON, $SiO_2$, and $SiN_x$.

The uneven pattern layer may include a plurality of protrusions arranged apart from each other in an island shape.

The uneven pattern layer may have a plurality of linear protrusions arranged to intersect in a mesh shape.

The display apparatus may further include a component in communication with an optical signal and/or an acoustic signal through the transmission area.

According to one or more embodiments, a manufacturing method of a display apparatus includes forming a display area on a substrate, forming a transmission area on the substrate, and forming an intermediate area between the display area and the transmission area, the intermediate area comprising a first sub-intermediate area and a second sub-intermediate area between the first sub-intermediate area and the transmission area, wherein, in the forming of the intermediate area, a number of layers of thin films stacked on the substrate in the first sub-intermediate area is different from a number of layers of thin films stacked on the substrate in the second sub-intermediate area.

The number of layers of thin films stacked on the substrate in the second sub-intermediate area may be less than the number of layers of thin films stacked on the substrate in the first sub-intermediate area.

The manufacturing method of the display apparatus may further include forming a sacrificial layer on the substrate in the second sub-intermediate area, forming a thin film layer on the sacrificial layer over the first sub-intermediate area and the second sub-intermediate area, and irradiating a laser beam to the second sub-intermediate area to remove the sacrificial layer and a thin film layer stacked on the sacrificial layer.

The manufacturing method of the display apparatus may further include forming an uneven pattern layer in which a plurality of protrusions and grooves is arranged in the second sub-intermediate area, wherein the sacrificial layer is formed on the uneven pattern layer such that the uneven pattern layer remains after the sacrificial layer and the thin film layer stacked on the sacrificial layer are removed.

The uneven pattern layer may include any of polysilicon, SiON, $SiO_2$, and $SiN_x$.

The forming of the display area may include forming a thin-film transistor including a semiconductor layer, a gate electrode, a source electrode, and a drain electrode on the substrate, and the uneven pattern layer may include a same material and be arranged in a same layer as the semiconductor layer.

The forming of the display area may include forming a display element including a pixel electrode connected to the thin-film transistor, an opposite electrode opposite the pixel electrode, and an intermediate layer between the pixel electrode and the opposite electrode.

The uneven pattern layer may be formed in a shape in which a plurality of protrusions are arranged apart from each other in an island shape.

The uneven pattern layer may be formed in a mesh shape in which a plurality of linear protrusions intersect each other.

The manufacturing method of the display apparatus may further include arranging a component in communication with an optical signal and/or an acoustic signal through the transmission area.

Additional aspects will be set forth, in part, in the description which follows and, in part, will be apparent from the description, or may be learned by practice of the presented embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
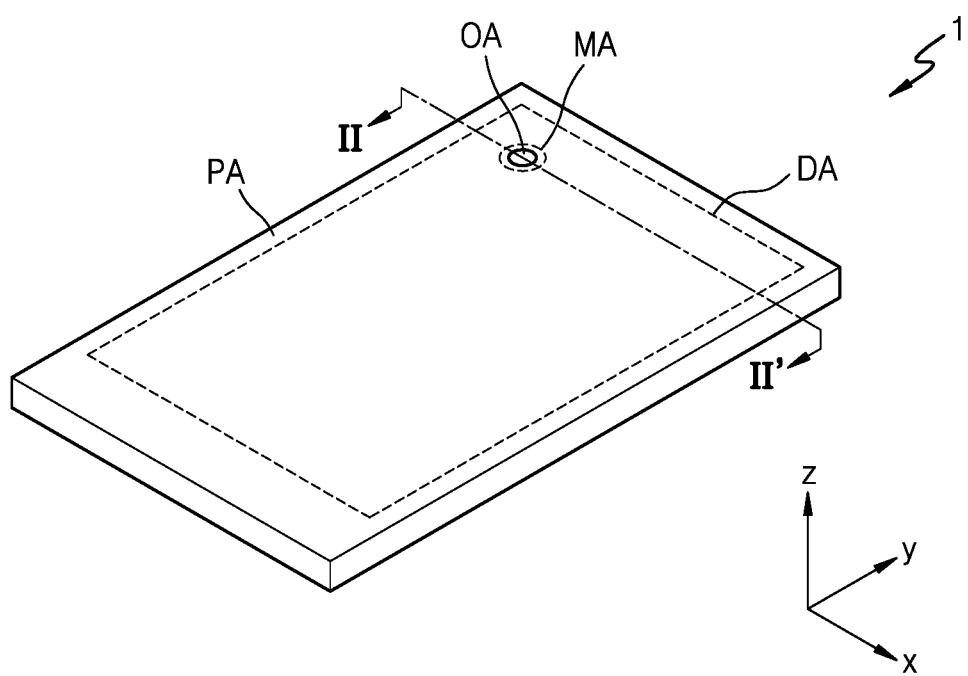
FIG. 1 is a perspective view of a display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Herein, some example embodiments will be described in further detail with reference to the accompanying drawings. The same reference numerals are used to denote the same elements, and repeated descriptions thereof will be omitted.

It is to be understood that although the terms "first," "second," etc. may be used herein to describe various components, these components should not be limited by these terms.

An expression used in the singular encompasses the expression of the plural, unless it has a clearly different meaning in the context.

It is to be further understood that the terms "comprises" and/or "comprising" used herein specify the presence of stated features or elements, but do not preclude the presence or addition of one or more other features or elements.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the term "A and/or B" refers to the case of A or B, or A and B.

It is to be understood that when a layer, region, or component is connected to another portion, the layer, region, or component may be directly connected to the portion or one or more intervening layers, regions, or components may exist, such that the layer, region, or component may be indirectly connected to the portion. For example, when a layer, region, or component is electrically connected to another portion, the layer, region, or component may be directly electrically connected to the portion or may be indirectly connected to the portion through one or more other layers, regions, or components.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display apparatus 1 according to an embodiment.

Referring to FIG. 1, the display apparatus 1 according to an embodiment may include a first area OA that is a transmission area, and a display area DA that is a second area at least partially surrounding the first area OA. The display apparatus 1 may provide a certain image using light emitted from a plurality of pixels arranged in the display area DA. FIG. 1 shows, as an example, that one first area OA may be arranged inside the display area DA, wherein the first area OA may be entirely surrounded by the display area DA. The first area OA may be an area in which components to be described later below with reference to FIG. 2 are arranged.

An intermediate area MA is arranged as a third area between the first area OA and the display area DA, which is a second area, and the display area DA may be surrounded by a peripheral area PA, which is a fourth area. The intermediate area MA and the peripheral area PA may be a kind of non-display area in which pixels are not arranged. In an embodiment, the intermediate area MA may be surrounded (e.g., entirely surrounded) by the display area DA, and the display area DA may be surrounded (e.g., entirely surrounded) by the peripheral area PA.

Herein, an organic light-emitting display apparatus is described as an example of the display apparatus 1 according to an embodiment, but a display apparatus of the disclosure is not limited thereto. As another embodiment, a display apparatus such as a quantum dot light-emitting display may be used.

Although FIG. 1 shows that one first area OA is provided and is substantially circular, the disclosure is not limited thereto. The number of first areas OA may be two or more, and a shape of each of the first areas OA may vary, and may have a shape of, for example, a circle, an oval, a polygon, a star, or a diamond.

Figure 2A:
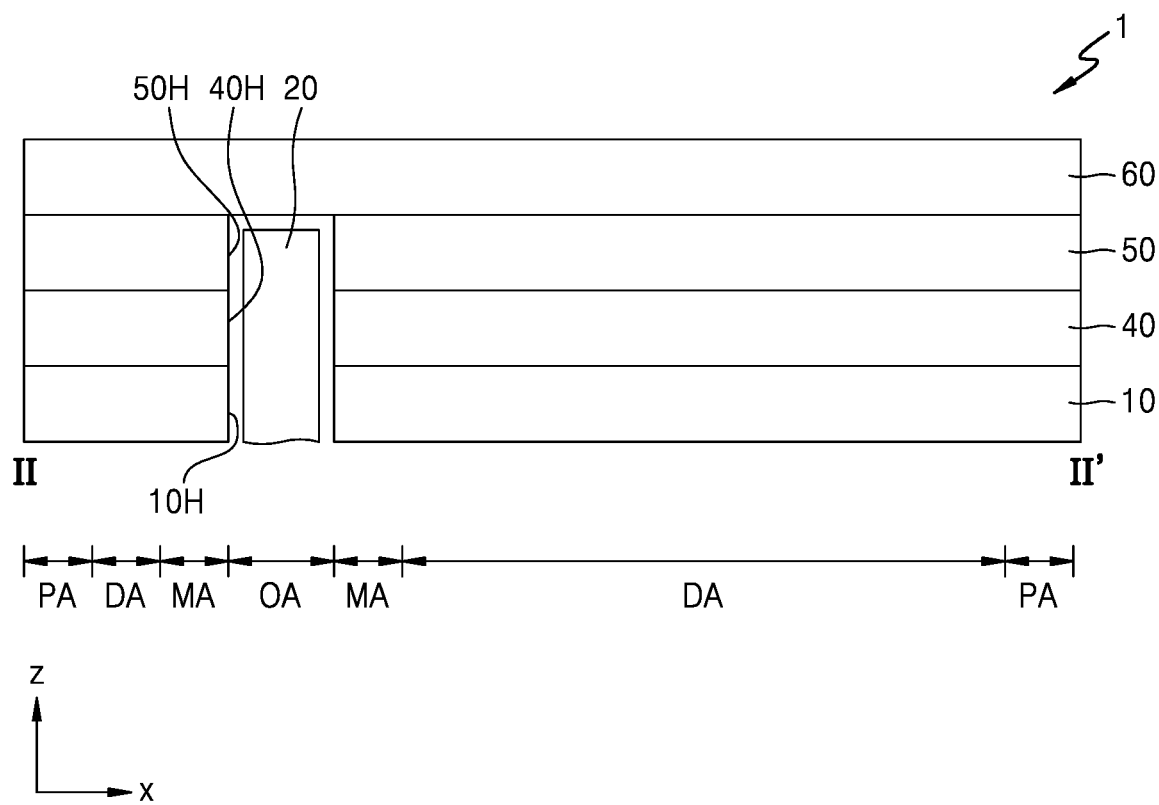
FIGS. 2A and 2B are cross-sectional views of a display apparatus according to some embodiments.
Figure 2B:
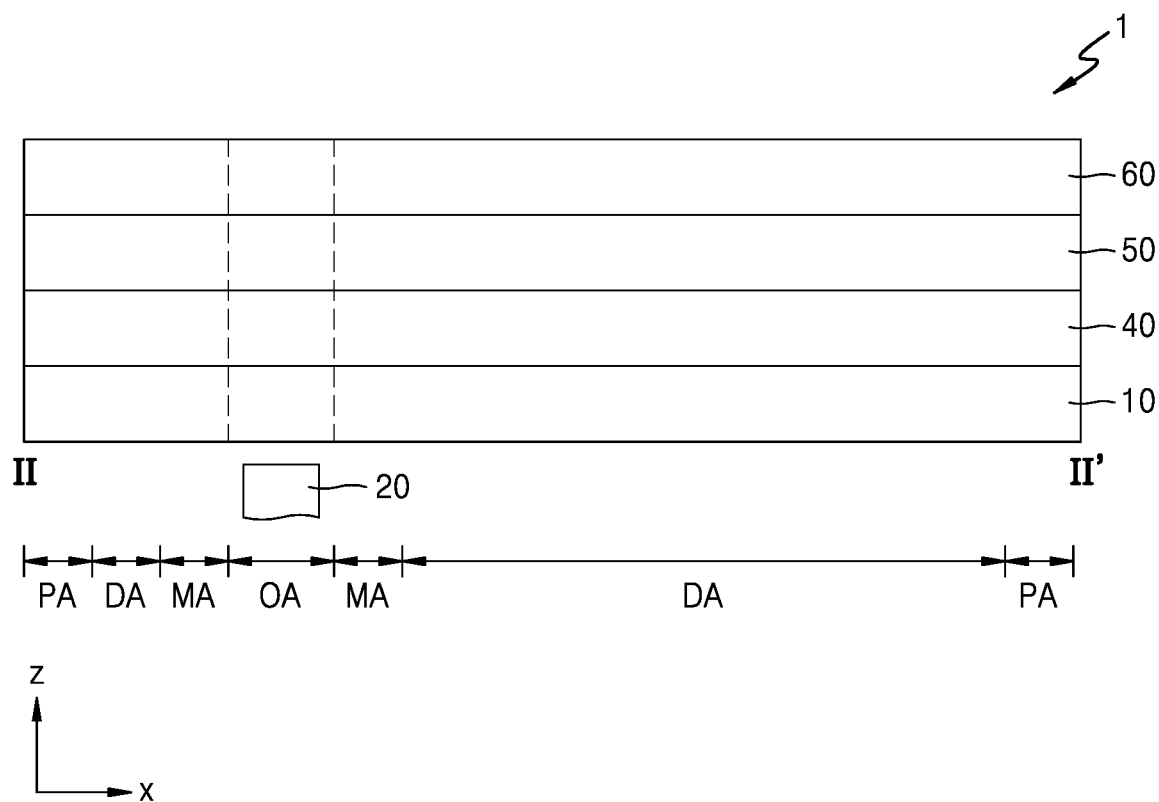

FIGS. 2A and 2B are cross-sectional views schematically showing the display apparatus 1 according to some embodiments, and may correspond to a cross-section of the display apparatus 1 taken along the line II-II' in FIG. 1.

Referring to FIG. 2A, in an embodiment, the display apparatus 1 may include a display panel 10, an input sensing layer 40 on the display panel 10, and an optical functional layer 50, which may be covered with a window 60. The display apparatus 1 may be any of a variety of electronic devices, such as a mobile phone, a laptop computer, and a smart watch.

The display panel 10 may display an image. The display panel 10 includes pixels arranged in the display area DA. The pixels may include a display element and a pixel circuit connected thereto. The display element may include an organic light-emitting diode, a quantum dot organic light-emitting diode, or the like.

The input sensing layer 40 obtains coordinate information according to an external input, for example, a touch event. The input sensing layer 40 may include a sensing electrode (or a touch electrode) and trace lines connected to the sensing electrode. The input sensing layer 40 may be on the display panel 10. The input sensing layer 40 may sense an external input by a mutual capacitance method and/or a self capacitance method.

The input sensing layer 40 may be formed directly on the display panel 10 or may be formed separately and then coupled to the display panel 10 through an adhesive layer, such as an optical clear adhesive. For example, the input sensing layer 40 may be continuously formed after the process of forming the display panel 10. In this case, the input sensing layer 40 may be a portion of the display panel 10, and the adhesive layer may not be between the input sensing layer 40 and the display panel 10. Although FIG. 2A illustrates that the input sensing layer 40 is between the display panel 10 and the optical functional layer 50, in another embodiment, the input sensing layer 40 may be on the optical functional layer 50.

In an embodiment, the optical functional layer 50 may include an antireflective layer. The antireflective layer may reduce the reflectance of light (external light) incident from the outside toward the display panel 10 through the window 60. In an embodiment, the antireflective layer may include a retarder and a polarizer. The retarder may be of a film type or a liquid crystal coating type and may include a $\lambda/2$ retarder and/or a $\lambda/4$ retarder. The polarizer may also be of a film type or a liquid crystal coating type. A film-type polarizer may include a stretch-type synthetic resin film, and a liquid crystal coating-type polarizer may include liquid crystals arranged in a certain arrangement. The retarder and the polarizer may further include a protective film. The protective film of the retarder and the polarizer may be defined as a base layer of the anti-reflection layer.

In another embodiment, the antireflection layer may include a black matrix and color filters. The color filters may be arranged considering the color of light emitted from each of the pixels of the display panel 10. In another embodiment, the antireflective layer may include a destructive interference structure. The destructive interference structure may include a first reflective layer and a second reflective layer on respective layers. First reflected light and second reflected light respectively reflected by the first reflective layer and second reflective layer may destructively interfere, and, thus, external light reflectance may be reduced.

In an embodiment, the optical functional layer 50 may include a lens layer. The lens layer may improve the luminous efficiency of light emitted from the display panel 10 or may reduce color deviation. The lens layer may include a layer having a concave or convex lens shape and/or may include a plurality of layers having different refractive indices. The optical functional layer 50 may include all or any of the above-described antireflective layer and lens layer.

In an embodiment, the optical functional layer 50 may be continuously formed after the process of forming the display panel 10 and/or the input sensing layer 40. In this case, the adhesive layer may not be between the optical functional layer 50 and the display panel 10 and/or the input sensing layer 40.

In an embodiment, the display panel 10, the input sensing layer 40, and/or the optical functional layer 50 may include openings. In this regard, FIG. 2A shows that the display panel 10, the input sensing layer 40, and the optical functional layer 50 include first to third openings 10H, 40H, and 50H, respectively, and the first to third openings 10H, 40H, and 50H overlap each other. The first to third openings 10H, 40H, and 50H are located to correspond to the first area OA. In another embodiment, one or more of the display panel 10, the input sensing layer 40, and the optical functional layer 50 may not include an opening. For example, any one or more selected from the display panel 10, the input sensing layer 40, and the optical functional layer 50 may not include an opening. In an embodiment, for example, the display panel 10, the input sensing layer 40, and the optical functional layer 50 may not include an opening, as illustrated in FIG. 2B.

As described above, the first area OA may be a kind of component area (e.g., a sensor area, a camera area, a speaker area, etc.) in which a component 20 for adding any of various functions to the display apparatus 1 is located. In an embodiment, the component 20 may be located in the first to third openings 10H, 40H, and 50H, as shown in FIG. 2A. In another embodiment, the component 20 may be under the display panel 10, as shown in FIG. 2B.

The component 20 may include an electronic element. For example, the component 20 may include an electronic component utilizing light or sound. For example, the electronic element may include a sensor that outputs and/or receives light, such as an infrared sensor, a camera that captures an image by receiving light, a sensor that outputs and detects light or sound to measure distance or recognize fingerprints, a small lamp that outputs light, a speaker that outputs sound, and the like. In the case of an electronic element using light, light of various wavelength bands, such as visible light, infrared light, ultraviolet light, and the like, may be used. In some embodiments, the first area OA may be a transmission area in which light and/or sound that is output from the component 20 to the outside or that travels from the outside toward the electronic element may be transmitted.

In another embodiment, when the display apparatus 1 is used as a smart watch or a vehicle instrument panel, the component 20 may be a member such as a clock needle or a needle indicating certain information (e.g., vehicle speed, etc.). In an embodiment, when the display apparatus 1 includes a clock needle or a vehicle instrument panel, the component 20 may be exposed to the outside through the window 60, and the window 60 may include an opening corresponding to the first area OA.

The component 20 may include one or more components associated with the function of the display panel 10 as described above, or may include one or more components, such as accessories, that increase aesthetics of the display panel 10. Although not shown in FIGS. 2A and 2B, in an embodiment, an optically transparent adhesive may be between the window 60 and the optical functional layer 50.

FIGS. 3A to 3D are cross-sectional views of the display panel 10 according to some embodiments.

Figure 3A:
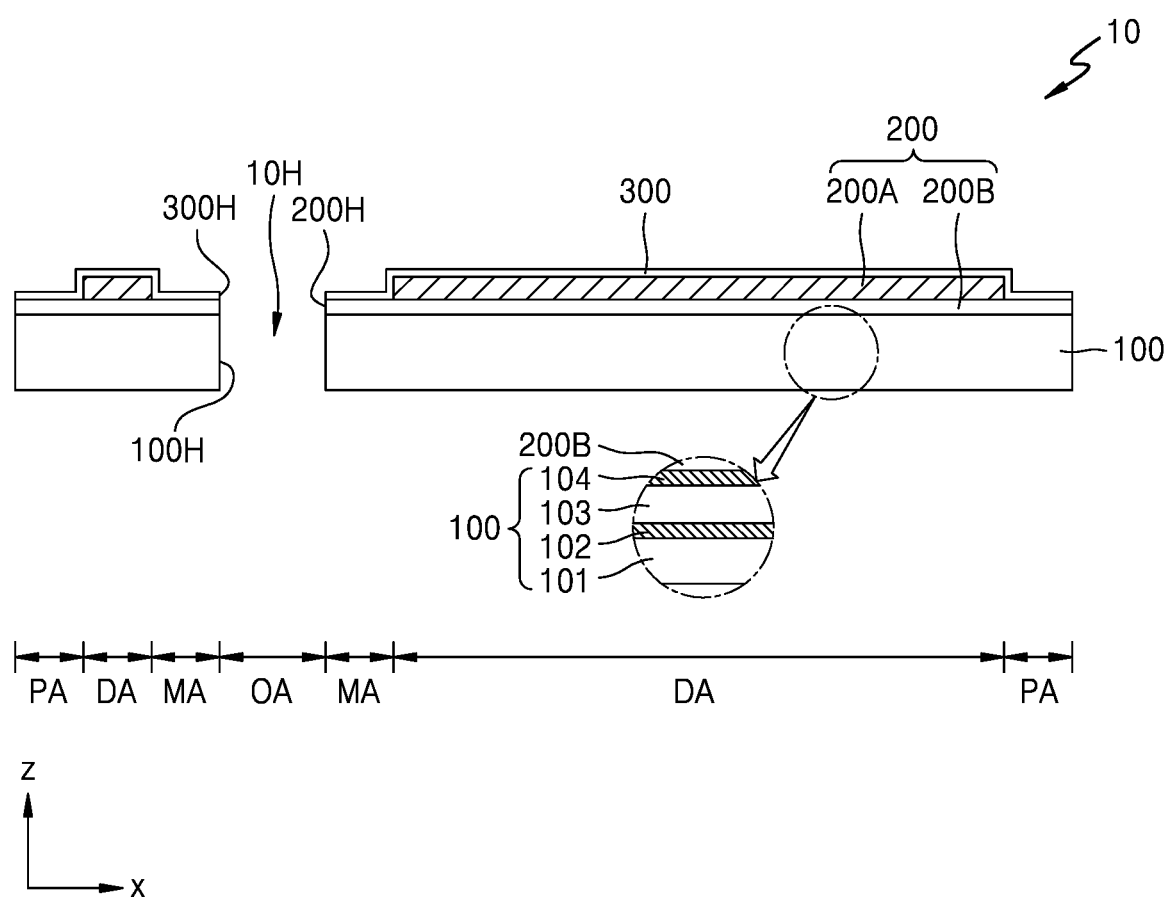
FIGS. 3A to 3D are cross-sectional views of a display panel according to some embodiments.

Referring to FIG. 3A, the display panel 10 includes a display layer 200 arranged on a substrate 100. The substrate 100 may include a glass material or a polymer resin. In an embodiment, the substrate 100 may be multiple layers. For example, as shown in the enlarged region of FIG. 3A, the substrate 100 may include a first base layer 101, a first barrier layer 102, a second base layer 103, and a second barrier layer 104.

Each of the first base layer 101 and the second base layer 103 may include a polymer resin. For example, the first base layer 101 and the second base layer 103 may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), and/or the like. The above-described polymer resin may be transparent.

Each of the first and second barrier layers 102 and 104 includes a barrier layer for preventing or substantially preventing penetration of external foreign matter and may include a single layer or multiple layers including inorganic materials, such as silicon nitride ($SiN_x$, x>0) or silicon oxide ($SiO_x$, x>0).

The display layer 200 includes a plurality of pixels. The display layer 200 may include a display element layer 200A including display elements arranged for each pixel, and a pixel circuit layer 200B including a pixel circuit and insulating layers arranged for each pixel. Each pixel circuit may include a thin-film transistor and a storage capacitor, and each display element may include an organic light-emitting diode OLED.

The display elements of the display layer 200 may be covered by an encapsulation member, such as a thin-film encapsulation layer 300, and, in an embodiment, the thin-film encapsulation layer 300 may include at least one inorganic encapsulation layer and at least one organic encapsulation layer. When the display panel 10 includes the substrate 100 including a polymer resin and the thin-film encapsulation layer 300 including an inorganic encapsulation layer and an organic encapsulation layer, the flexibility of the display panel 10 may be improved.

The display panel 10 may include the first opening 10H penetrating the display panel 10. The first opening 10H may be located in the first area OA, in which case the first area OA may be a kind of opening area. FIG. 3A shows that the substrate 100 and the thin-film encapsulation layer 300 respectively include through holes 100H and 300H corresponding to the first opening 10H of the display panel 10. The display layer 200 may also include a through hole 200H corresponding to the first area OA.

Figure 3B:
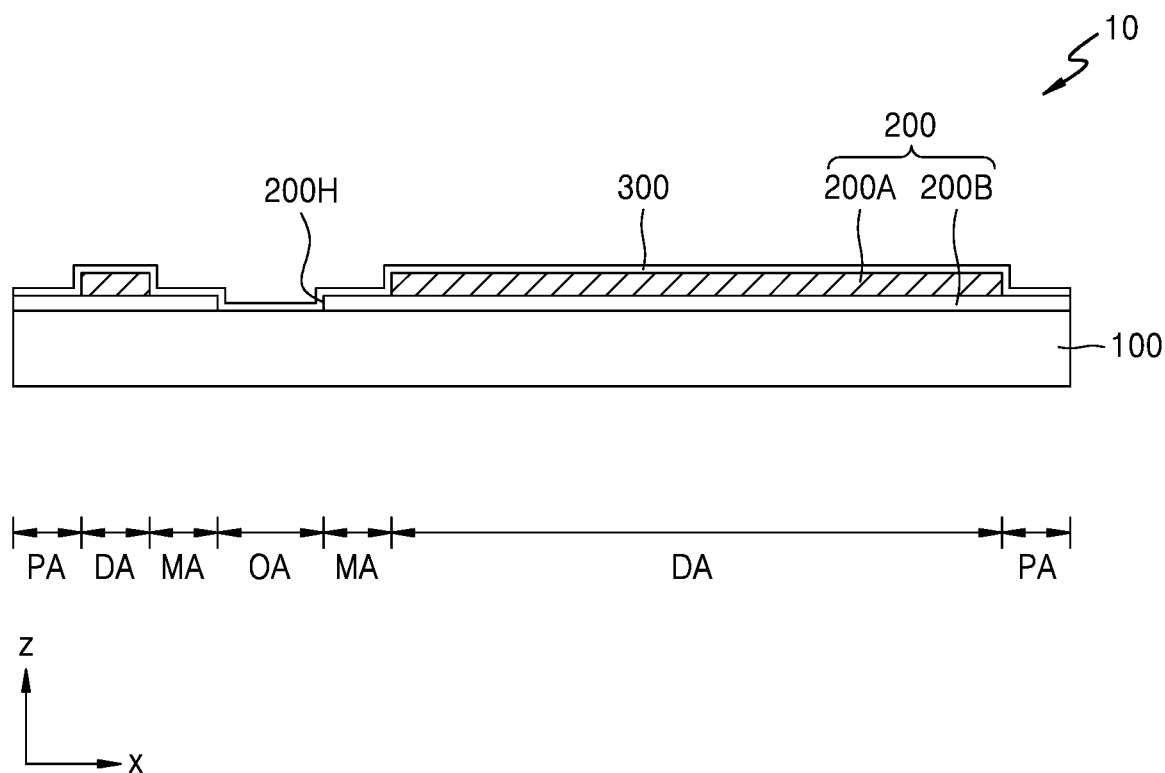

In another embodiment, as shown in FIG. 3B, the substrate 100 may not include a through hole corresponding to the first area OA. The display layer 200 may include the through hole 200H corresponding to the first area OA. The thin-film encapsulation layer 300 may not include a through hole corresponding to the first area OA. In another embodiment, as shown in FIG. 3C, the display layer 200 may not include the through hole 200H corresponding to the first area OA, and the display element layer 200A is not located in the first area OA.

Figure 3C:
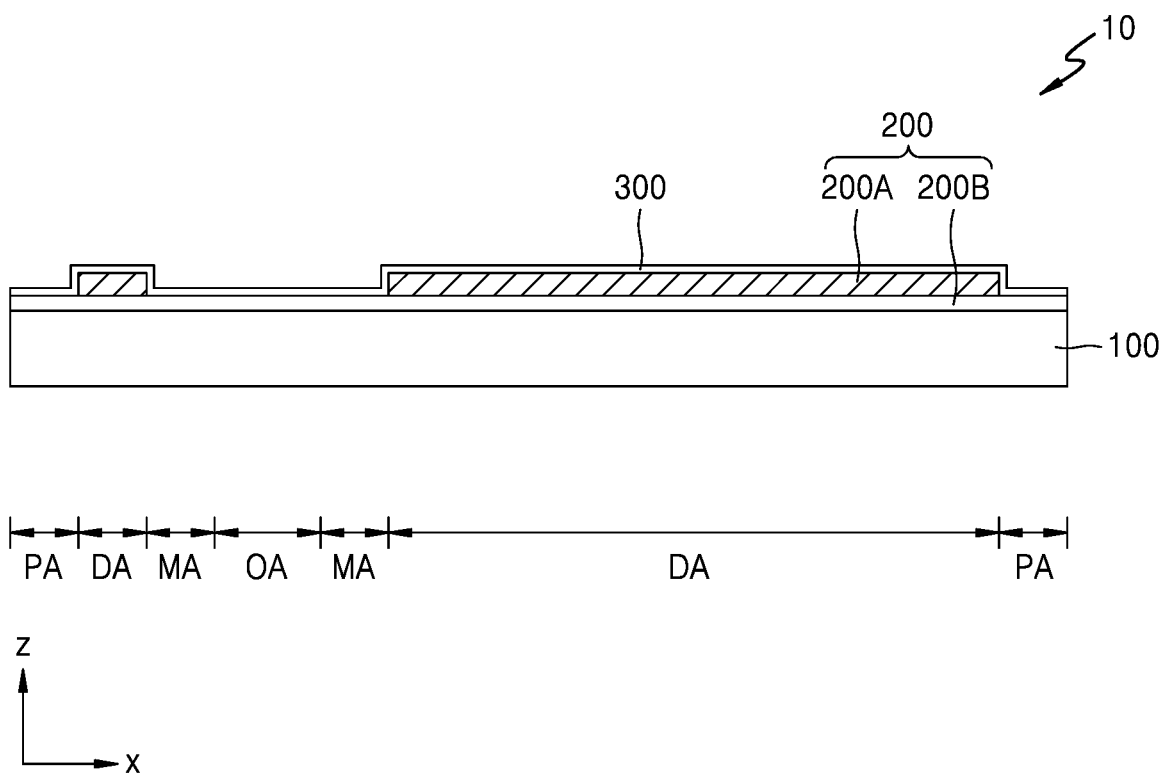
Figure 3D:
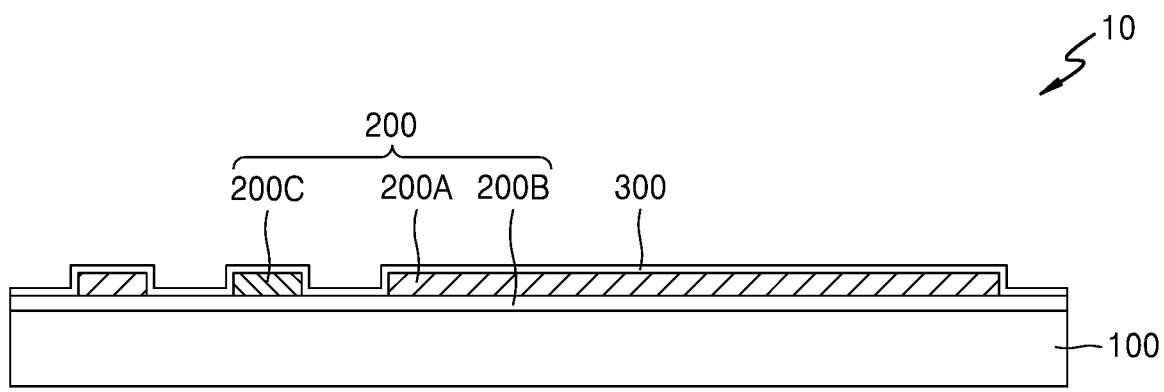
Figure 3D:
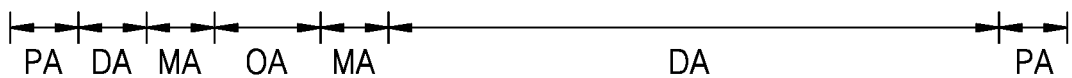

FIGS. 3A to 3C show that the display element layer 200A is not arranged in the first area OA, but embodiments of the disclosure are not limited thereto. In another embodiment, as shown in FIG. 3D, an auxiliary display element layer 200C may be located in the first area OA. The auxiliary display element layer 200C may include a display element that operates in a different structure and/or in a different manner from the display element of the display element layer 200A.

In an embodiment, each pixel of the display element layer 200A may include an active organic light-emitting diode, and the auxiliary display element layer 200C may include pixels including passive-type organic light-emitting diodes, respectively. When the auxiliary display element layer 200C includes a passive organic light-emitting diode as a display element, elements that constitute a pixel circuit may not be under the passive organic light-emitting diode. For example, a portion of the pixel circuit layer 200B below the auxiliary display element layer 200C does not include a transistor and a storage capacitor.

In another embodiment, the auxiliary display element layer 200C may include display elements of a same type (e.g., an active organic light-emitting diode) as the display element layer 200A, but a pixel circuit thereunder may be different. For example, the pixel circuit under the auxiliary display element layer 200C (e.g., a pixel circuit having a light shielding film between a substrate and a transistor) may include a structure different from that of the pixel circuit under the display element layer 200A. In an embodiment, the display elements of the auxiliary display element layer 200C may operate according to control signals different from those of the display elements of the display element layer 200A. In an embodiment, a component (e.g., an infrared sensor, etc.) that does not require relatively high transmittance may be arranged in the first area OA in which the auxiliary display element layer 200C is arranged. In this case, the first area OA may be a component area and an auxiliary display area.

FIGS. 4A to 4D are cross-sectional views of a display panel 10' according to some further embodiments. Unlike the display panel 10 described with reference to FIGS. 3A to 3D including the thin-film encapsulation layer 300, the display panel 10' of FIGS. 4A to 4D may include an encapsulation substrate 300A and a sealant 340.

Figure 4A:
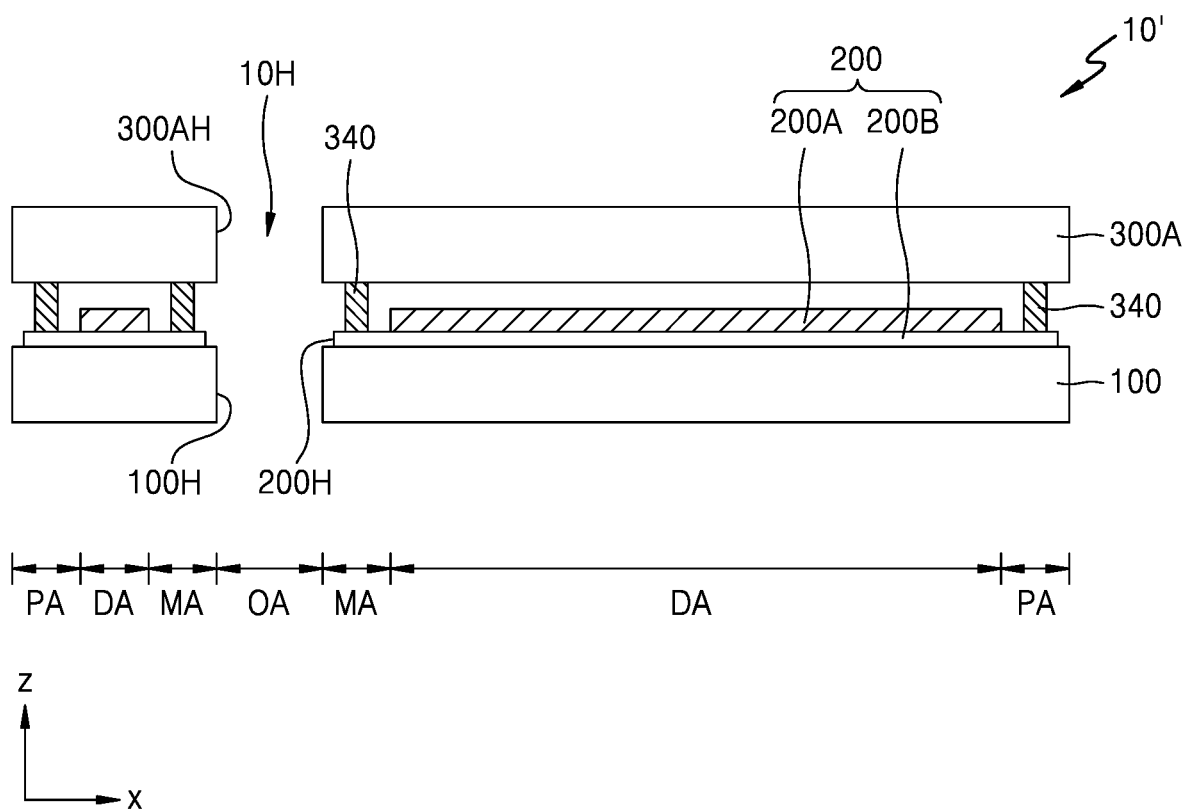
FIGS. 4A to 4D are cross-sectional views of a display panel according to some further embodiments.
Figure 4B:
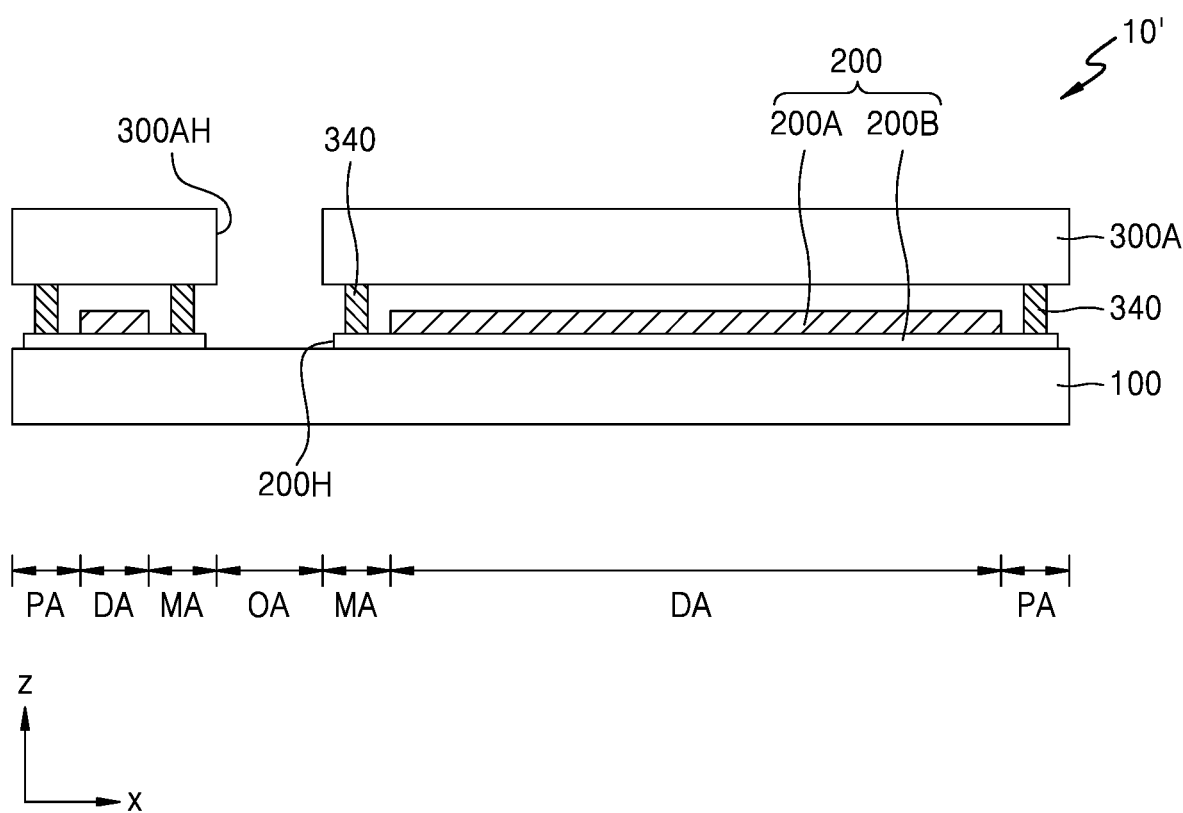
Figure 4C:
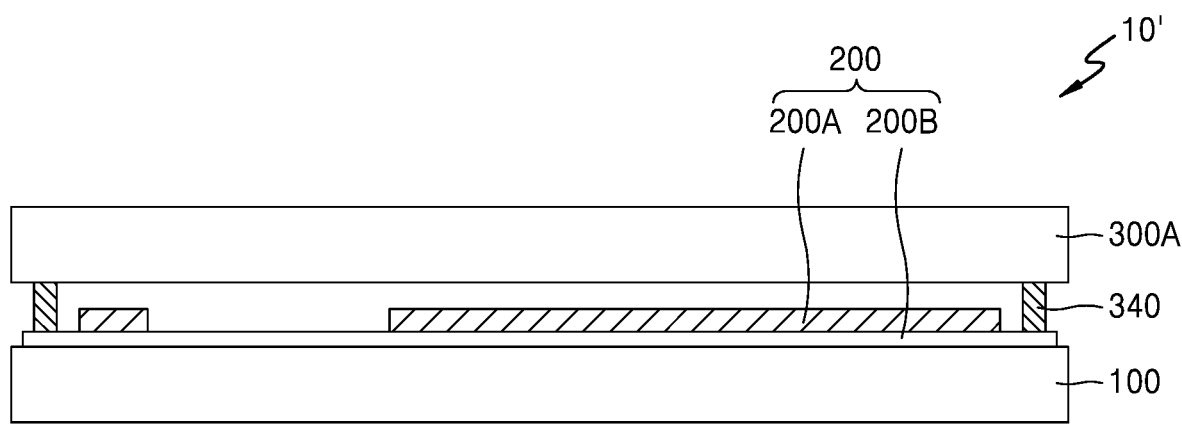
Figure 4D:
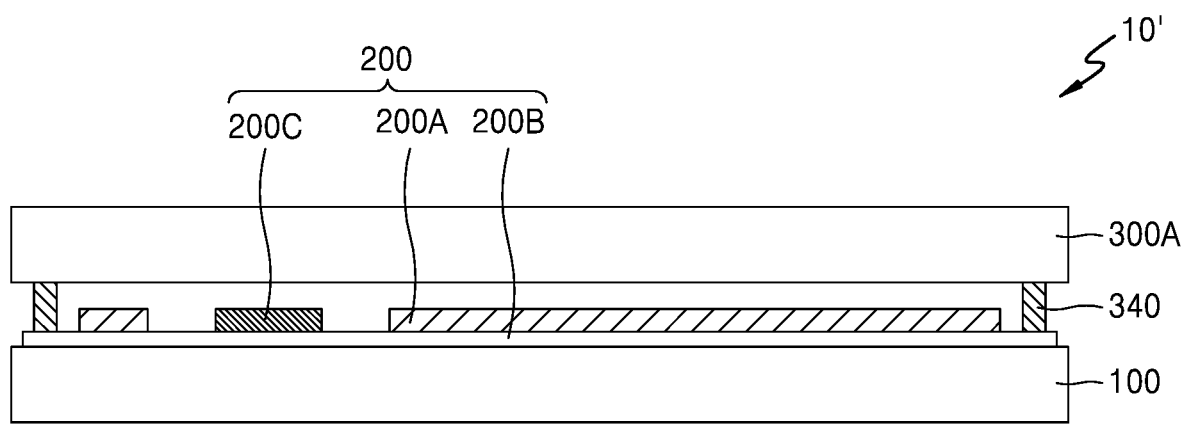

As shown in FIGS. 4A to 4C, one or more of the substrate 100, the display layer 200, and the encapsulation substrate 300A may have through holes 100H, 200H, and 300AH, respectively, corresponding to the first area OA. The display element layer 200A may not be arranged in the first area OA, or the auxiliary display element layer 200C may be arranged in the first area OA, as shown in FIG. 4D. The auxiliary display element layer 200C has been described above with reference to FIG. 3D.

Figure 5A:
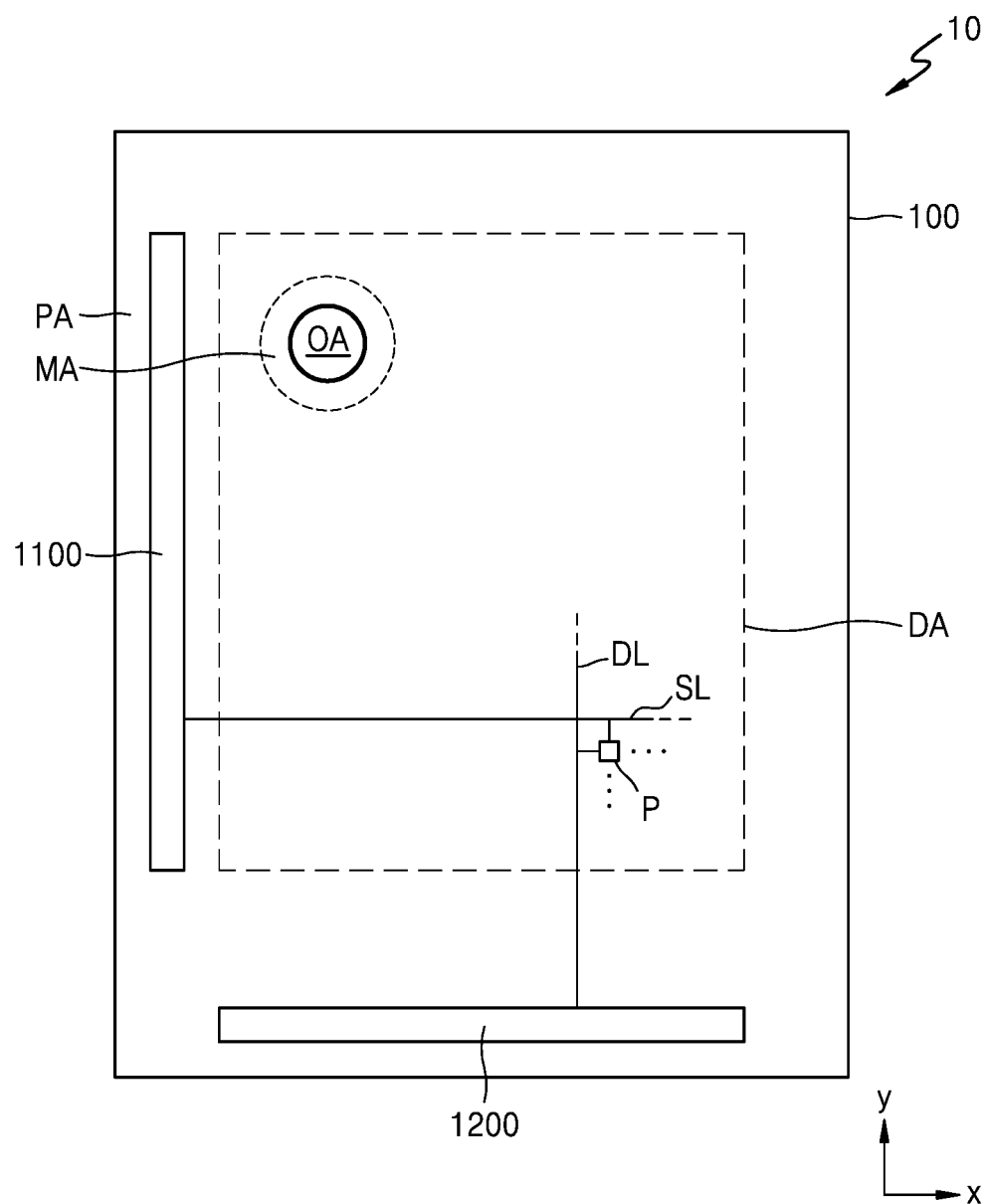
FIGS. 5A and 5B are plan views of a display panel according to some embodiments.
Figure 5B:
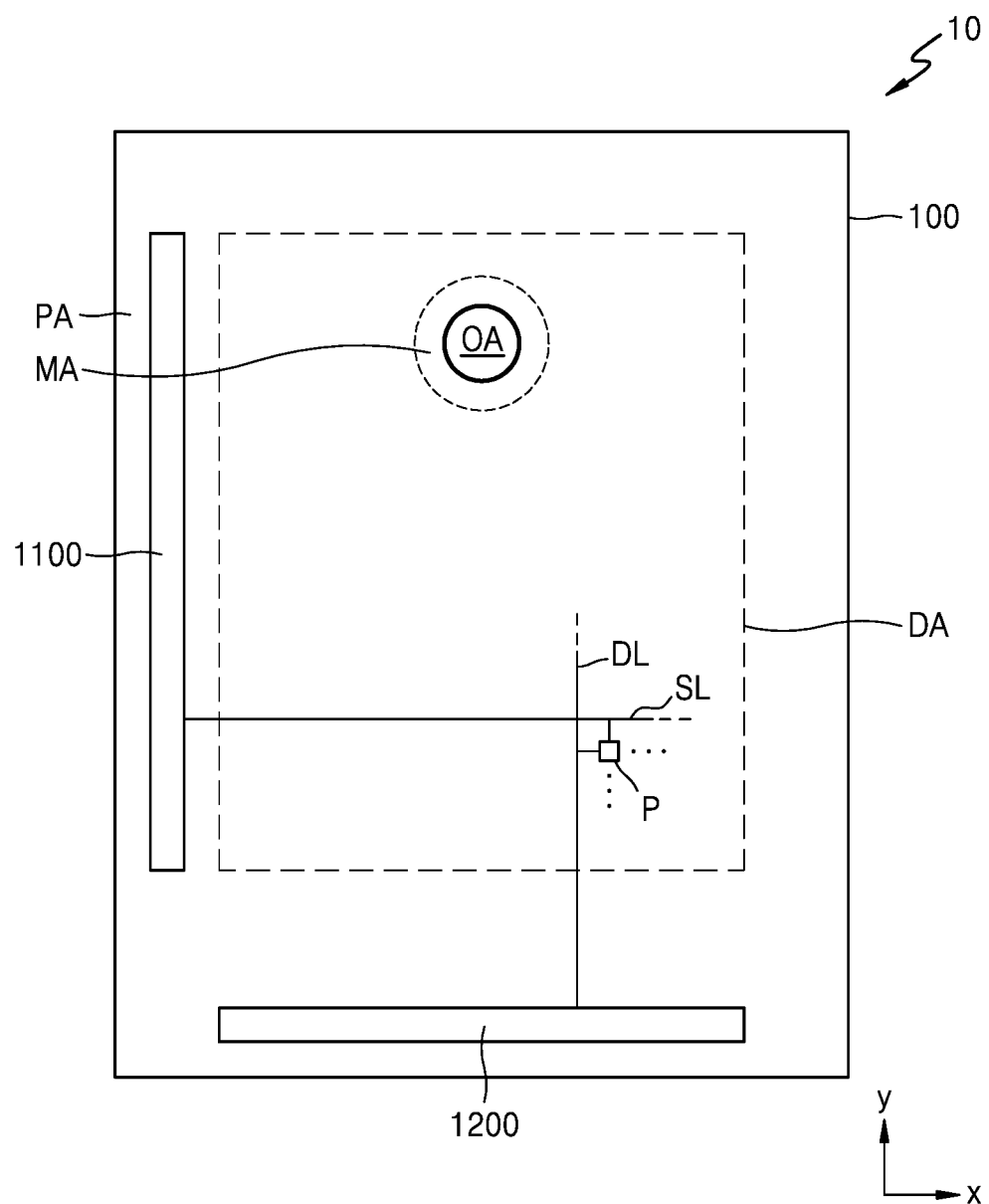
Figure 6:
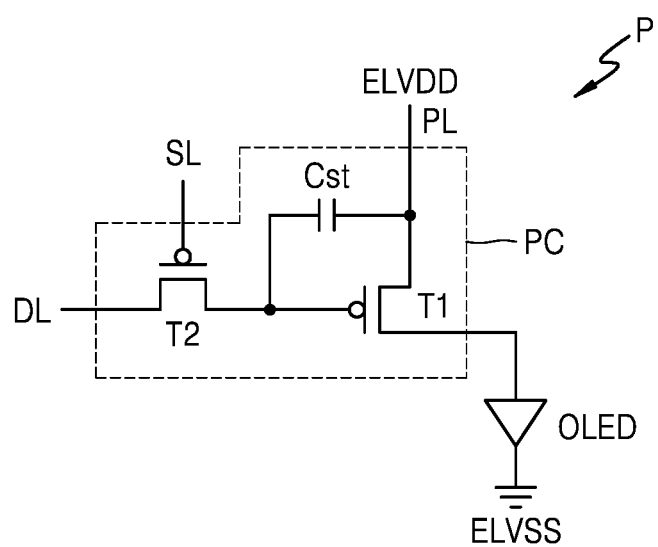
FIG. 6 is an equivalent circuit diagram of a pixel of a display panel according to an embodiment.

FIGS. 5A and 5B are plan views of the display panel 10 according to some embodiments; and FIG. 6 is an equivalent circuit diagram of a pixel of the display panel 10 according to an embodiment.

Referring to FIG. 5A, the display panel 10 may include the first area OA, the display area DA as a second area, the intermediate area MA as a third area, and the peripheral area PA as a fourth area. FIG. 5A may be understood as a view of the substrate 100 of the display panel 10. For example, the substrate 100 may have the first area OA, the display area DA, the intermediate area MA, and the peripheral area PA.

The display panel 10 includes a plurality of pixels P arranged in the display area DA. Each pixel P, in an embodiment, as shown in FIG. 6, may include a pixel circuit PC and an organic light-emitting diode OLED as a display element connected to the pixel circuit PC. The pixel circuit PC may include a first thin-film transistor T1, a second thin-film transistor T2, and a storage capacitor Cst. Each pixel P may emit, for example, red, green, or blue light from the organic light-emitting diode OLED. In another embodiment, each pixel P may emit, for example, red, green, blue, or white light from the organic light-emitting diode OLED.

The second thin-film transistor T2 includes a switching thin-film transistor, which is connected to a scan line SL and a data line DL, and may be configured to transfer data voltage input from the data line DL to the first thin-film transistor T1 based on a switching voltage input from the scan line SL. The storage capacitor Cst is connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1 includes a driving thin-film transistor, which is connected to the driving voltage line PL and the storage capacitor Cst, and may control a driving current flowing to the organic light-emitting diode OLED from the driving voltage line PL according to a voltage value stored in the storage capacitor Cst. The organic light-emitting diode OLED may emit light having a certain luminance according to the driving current. An opposite electrode (e.g., a cathode) of the organic light-emitting diode OLED may be supplied with a second power supply voltage ELVSS.

FIG. 6 illustrates that the pixel circuit PC includes two thin-film transistors and one storage capacitor, but the disclosure is not limited thereto. The number of thin-film transistors and the number of storage capacitors may be variously changed according to a design of the pixel circuit PC. For example, the pixel circuit PC may further include four or more thin-film transistors in addition to the aforementioned two thin-film transistors.

Referring again to FIG. 5A, in an embodiment, the intermediate area MA may surround the first area OA on a plane. The intermediate area MA is an area in which a display element, such as an organic light-emitting diode, that emits light is not arranged, and signal lines that provide signals to the pixels P around the first area OA may pass through the intermediate area MA. The peripheral area PA may include a scan driver 1100 for providing a scan signal to each pixel P, a data driver 1200 for providing a data signal to each pixel P, and main power lines (not shown) for providing first and second power supply voltages. FIG. 5A shows that the data driver 1200 is adjacent to a side of the substrate 100. However, according to another embodiment, the data driver 1200 may be on a flexible printed circuit board (FPCB) electrically connected to a pad on a side of the display panel 10. In addition, FIG. 5A illustrates a structure in which the first area OA is arranged on the upper left side of the display area DA, but, as shown in FIG. 5B, the first area OA may also be at the top center of the display area DA, for example.

Figure 7A:
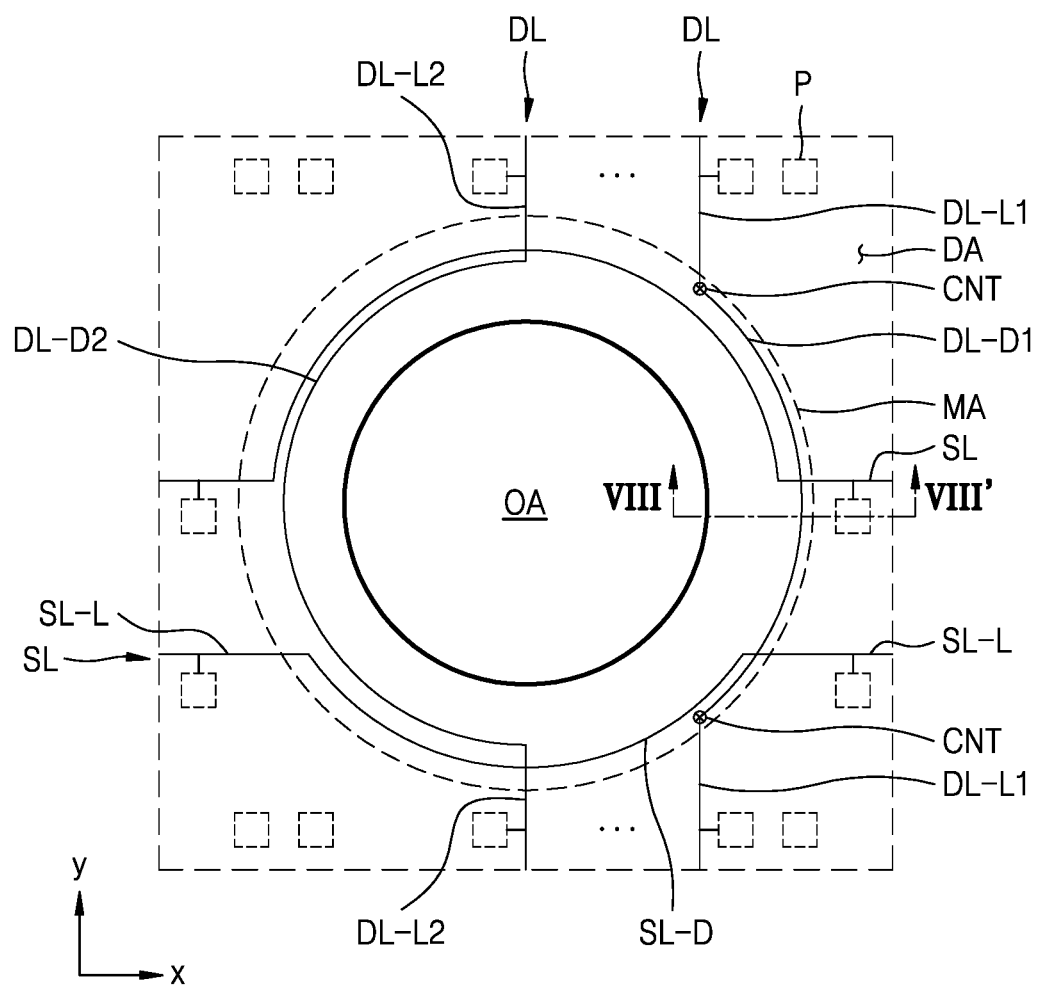
FIGS. 7A and 7B are plan views of a transmission area of a display panel according to some embodiments.
Figure 7B:
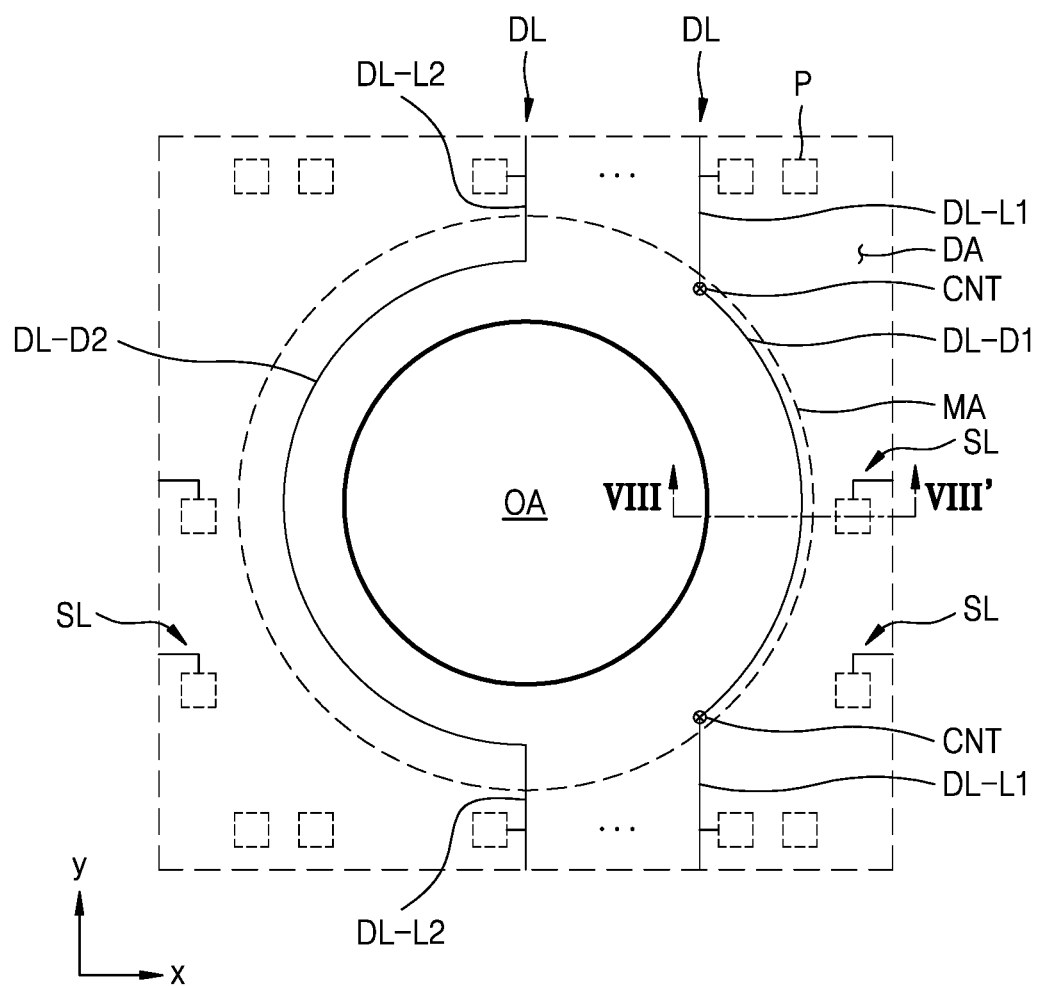

FIGS. 7A and 7B are plan views of a portion of a display panel according to some embodiments.

Referring to FIG. 7A, the pixels P are arranged in the display area DA around the transmission area OA. Some pixels P may be apart from each other with respect to the transmission area OA, and the transmission area OA may be defined between the pixels P. For example, the pixels P may be arranged above and below or on the left and right of the transmission area OA, respectively.

Signal lines adjacent to the transmission area OA from among signal lines for supplying signals to the pixels P may bypass the transmission area OA. At least one of data lines passing across the display area DA on the plane of FIG. 7A extends in a y direction to provide data signals to the pixels P arranged above and below the transmission area OA and may bypass along an edge of the transmission area OA in the intermediate area MA. At least one of scan lines SL passing across the display area DA on the plane of FIG. 7A extends in an x direction to provide scan signals to the pixels P on the left and right sides of the transmission area OA and may bypass along the edge of the transmission area OA in the intermediate area MA.

In an embodiment, the bypass portion (or circuitous portion) SL-D of the scan line SL is on a same layer as an extension portion SL-L crossing the display area DA and may be integrally formed. In an embodiment, a bypass portion DL-D1 of at least one of data lines DL may be formed on a layer different from an extension portion DL-L1 crossing the display area DA. The bypass portion DL-D1 of the data line DL and the extension portion DL-L1 may be connected to each other through a contact hole CNT. In an embodiment, a bypass portion DL-D2 of at least one of the data lines DL is on the same layer as an extension portion DL-L2 and may be integrally formed.

In an embodiment, as illustrated in FIG. 7B, the scan line SL may be cut off left and right about the transmission area OA without a bypass portion. That is, the scan driver 1100 described above may be arranged one by one on the left and right sides of the display area DA such that pixels on the left side of the transmission area OA may be connected to the scan driver 1100 on the left side, and pixels on the right side of the transmission area OA may be connected to the scan driver 1100 on the right side. In this case, the scan line SL does not need to be connected as one while bypassing the transmission area OA.

Figure 8:
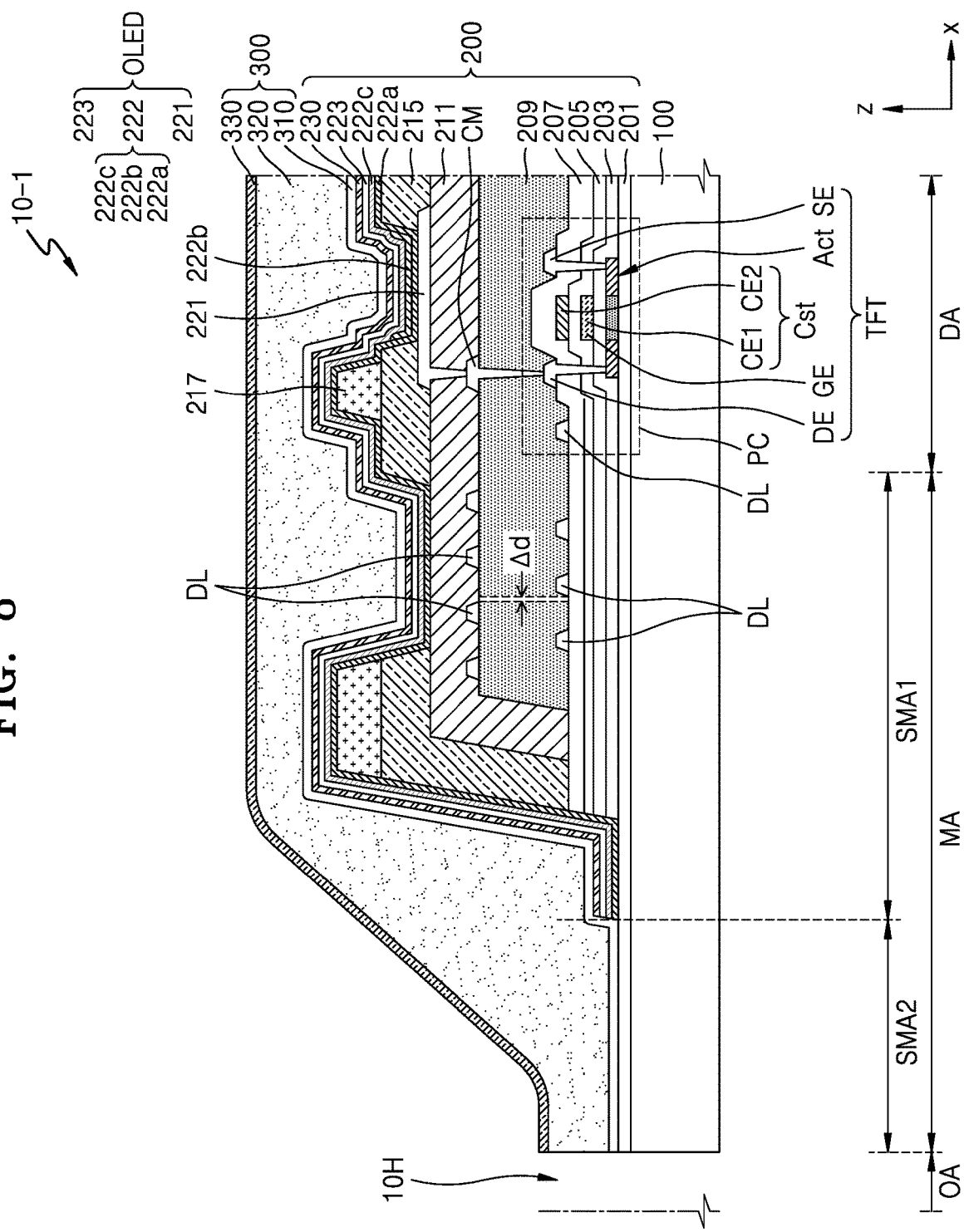
FIG. 8 is a cross-sectional view of the display panel taken along the line VIII-VIII' of FIG. 7A or 7B.

FIG. 8 is a cross-sectional view of a display panel 10-1 according to an embodiment and may correspond to a cross-section of the portion of the display panel taken along the line VIII-VIII' of FIG. 7A or 7B; and FIGS. 9A to 9D are cross-sectional views illustrating a manufacturing process of the display panel 10-1 of FIG. 8.

Referring to the display area DA of FIG. 8, the substrate 100 may include a glass material or a polymer resin. In an embodiment, the substrate 100 may include a plurality of sublayers, as shown in the enlarged region of FIG. 3A.

A buffer layer 201 may be formed on the substrate 100 to prevent or substantially prevent impurities from penetrating into a semiconductor layer Act of a thin-film transistor TFT. The buffer layer 201 may include an inorganic insulating material, such as any of silicon nitride, silicon oxynitride, and silicon oxide, and may include a single layer or multiple layers including the inorganic insulating material described above.

A pixel circuit PC may be on the buffer layer 201. The pixel circuit PC includes the thin-film transistor TFT and a storage capacitor Cst. The thin-film transistor TFT may include the semiconductor layer Act, a gate electrode GE, a source electrode SE, and a drain electrode DE. The thin-film transistor TFT shown in FIG. 8 may correspond to the driving thin-film transistor described with reference to FIG. 6. Although not shown in FIG. 8, a data line DL of the pixel circuit PC is electrically connected to a switching thin-film transistor included in the pixel circuit PC. The present embodiment shows a top gate type transistor in which the gate electrode GE is above the semiconductor layer Act with a gate insulating layer 203 therebetween. However, according to another embodiment, the thin-film transistor TFT may also be a bottom gate type transistor.

In an embodiment, the semiconductor layer Act may include polysilicon. In another embodiment, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), and/or the like. The gate electrode GE may include a single layer or multiple layers including the above-described materials.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, hafnium oxide, and the like. The gate insulating layer 203 may include a single layer or multiple layers including the above-described materials.

The source electrode SE and the drain electrode DE may be on a same layer as the data line DL and may include a same material as that of the data line DL. The source electrode SE, the drain electrode DE, and the data line DL may include a material having high conductivity. The source electrode SE and the drain electrode DE may include a conductive material including Mo, Al, Cu, Ti, or the like, and may be formed as a single layer or multiple layers including the above-described materials. In an embodiment, the source electrode SE, the drain electrode DE, and the data line DL may include multiple layers of Ti/Al/Ti.

The storage capacitor Cst may include a lower electrode CE1 and an upper electrode CE2 which overlap each other with a first interlayer insulating layer 205 therebetween. The storage capacitor Cst may overlap the thin-film transistor TFT. In this regard, FIG. 8 shows that the gate electrode GE of the thin-film transistor TFT is a lower electrode CE1 of the storage capacitor Cst. In another embodiment, the storage capacitor Cst may not overlap the thin-film transistor TFT. The storage capacitor Cst may be covered with a second interlayer insulating layer 207. An upper electrode CE2 of the storage capacitor Cst may include a conductive material including Mo, Al, Cu, Ti, and/or the like. The source electrode SE and the drain electrode DE may include a single layer or multiple layers including the above material.

The first interlayer insulating layer 205 and the second interlayer insulating layer 207 may include an inorganic insulating material, such as silicon oxide, silicon nitride, silicon oxynitride, aluminum oxide, titanium oxide, tantalum oxide, hafnium oxide, and/or the like. The first interlayer insulating layer 205 and the second interlayer insulating layer 207 may include a single layer or multiple layers including the above materials.

The pixel circuit PC including the thin-film transistor TFT and the storage capacitor Cst may be covered with a first organic insulating layer 209. The first organic insulating layer 209 may include a substantially planar top surface.

The pixel circuit PC may be electrically connected to a pixel electrode 221. For example, as shown in FIG. 8, a contact metal layer CM may be between the thin-film transistor TFT and the pixel electrode 221. The contact metal layer CM may be connected to the thin-film transistor TFT through a contact hole formed in the first organic insulating layer 209, and the pixel electrode 221 may be connected to the contact metal layer CM through a contact hole formed in a second organic insulating layer 211 on the contact metal layer CM. The contact metal layer CM may include a conductive material including molybdenum (Mo), aluminum (Al), copper (Cu), titanium (Ti), or the like. The contact metal layer CM may include a single layer or multiple layers including the above-described materials. In an embodiment, the contact metal layer CM may include multiple layers of Ti/Al/Ti.

The first organic insulating layer 209 and the second organic insulating layer 211 may include an organic insulating material such as a general commercial polymer, such as any of polymethyl methacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and a blend thereof. In an embodiment, the first organic insulating layer 209 and the second organic insulating layer 211 may include polyimide.

The pixel electrode 221 may be formed on the second organic insulating layer 211. The pixel electrode 221 may include a conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 221 may include a reflective layer including Ag, Mg, Al, Pt, Pd, Au, Ni, Nd, Ir, Cr, or a compound thereof. In another embodiment, the pixel electrode 221 may further include a film formed of ITO, IZO, ZnO, or $In_2O_3$ above/below the above-described reflective layer.

A pixel defining layer 215 may be formed on the pixel electrode 221. The pixel defining layer 215 may include an opening exposing a portion of an upper surface of the pixel electrode 221 and may cover an edge of the pixel electrode 221. The pixel defining layer 215 may include an organic insulating material. Alternatively, the pixel defining layer 215 may include an inorganic insulating material such as silicon nitride (SiNx), silicon oxynitride (SiON), or silicon oxide (SiOx). In an embodiment, the pixel defining layer 215 may include an organic insulating material and an inorganic insulating material.

An intermediate layer 222 includes a light emitting layer 222b. The intermediate layer 222 may include a first functional layer 222a under the light emitting layer 222b and/or a second functional layer 222c on the light emitting layer 222b. The light emitting layer 222b may include a polymer organic material or a low molecular weight organic material that emits light of a certain color.

The first functional layer 222a may include a single layer or multiple layers. For example, when the first functional layer 222a includes a polymer, the first functional layer 222a may include a hole transport layer (HTL) having a single-layer structure and may include 3,4-ethylene-dihydroxythiophene (PEDOT) or polyaniline (PANI). In an embodiment, when the first functional layer 222a is formed of a low molecular weight material, the first functional layer 222a may include a hole injection layer (HIL) and a hole transport layer (HTL).

In an embodiment, the second functional layer 222c may be omitted. For example, when the first functional layer 222a and the light emitting layer 222b include a polymer material, the second functional layer 222c may be formed. The second functional layer 222c may include a single layer or multiple layers. In an embodiment, the second functional layer 222c may include an electron transport layer (ETL) and/or an electron injection layer (EIL).

The light emitting layer 222b in the intermediate layer 222 may be arranged for each pixel in the display area DA. In an embodiment, the light emitting layer 222b may be patterned to correspond to the pixel electrode 221. In an embodiment, unlike the light emitting layer 222b, the first functional layer 222a and/or the second functional layer 222c of the intermediate layer 222 may extend toward the intermediate area MA to be located not only in the display area DA but also in the intermediate area MA.

The opposite electrode 223 may include a conductive material having a low work function. For example, the opposite electrode 223 may include a (semi)transparent layer including Ag, Mg, Al, Pt, Pd, Au, Ni, Nd, Ir, Cr, lithium (Li), calcium (Ca), or an alloy thereof. In an embodiment, the opposite electrode 223 may further include a layer such as ITO, IZO, ZnO, or $In_2O_3$ on the (semi)transparent layer including the above-mentioned material. The opposite electrode 223 may be formed not only in the display area DA, but also in the intermediate area MA. In an embodiment, the first functional layer 222a, the second functional layer 222c, and the opposite electrode 223 may be formed by thermal evaporation.

In an embodiment, a capping layer 230 may be on the opposite electrode 223. For example, the capping layer 230 may include LiF and may be formed by thermal evaporation. In some embodiments, the capping layer 230 may be omitted.

A spacer 217 may be formed on the pixel defining layer 215. The spacer 217 may include an organic insulating material, such as polyimide. In an embodiment, the spacer 217 may include an inorganic insulating material, or may include an organic insulating material and an inorganic insulating material.

The spacer 217 may include a material different from that of the pixel defining layer 215, or may include a same material as that of the pixel defining layer 215. In an embodiment, the pixel defining layer 215 and the spacer 217 may include polyimide. In an embodiment, the pixel defining layer 215 and the spacer 217 may be formed together in a mask process using a halftone mask.

The organic light-emitting diode OLED is covered with the thin-film encapsulation layer 300. In an embodiment, the thin-film encapsulation layer 300 may include at least one organic encapsulation layer and at least one inorganic encapsulation layer. For example, FIG. 8 shows that the thin-film encapsulation layer 300 includes a first inorganic encapsulation layer 310, a second inorganic encapsulation layer 330, and an organic encapsulation layer 320 therebetween. In another embodiment, the number of organic encapsulation layers, the number of inorganic encapsulation layers, and/or a stacking order may be changed.

In an embodiment, the first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or multiple layers including the aforementioned materials. In an embodiment, the organic encapsulation layer 320 may include a polymer-based material, and examples of the polymer-based material may include an acrylic resin, an epoxy resin, polyimide, and/or polyethylene. In an embodiment, the organic encapsulation layer 320 may include acrylate.

In an embodiment, thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thickness of the first inorganic encapsulation layer 310 may be the same as that of the second inorganic encapsulation layer 330.

Referring to the intermediate area MA of FIG. 8, the intermediate area MA may include a first sub-intermediate area SMA1 relatively far from the transmission area OA, and a second sub-intermediate area SMA2 relatively close to the transmission area OA. Lines bypassing the transmission area OA may be arranged in the intermediate area MA.

Lines, for example, as shown in FIG. 8, the data lines DL, may be located in the first sub-intermediate area SMA1. The data lines DL of the first sub-intermediate area SMA1 illustrated in FIG. 8 correspond to bypass portions (e.g., DL-D1 and DL-D2) of the data lines DL described above with reference to FIGS. 7A and 7B. The first sub-intermediate area SMA1 may be understood as a line area or a bypass area in which lines such as the data lines DL bypass the transmission area OA.

The data lines DL may be alternately arranged with each other via an insulating layer. In an embodiment, for example, one of the neighboring data lines DL is below an insulating layer (e.g., the first organic insulating layer 209), and the other is above the insulating layer (e.g., the first organic insulating layer 209). When the data lines DL are alternately arranged with the insulating layer therebetween, a distance Δd (pitch) between the data lines may be reduced. FIG. 8 illustrates the data lines DL located in the first sub-intermediate area SMA1. However, the scan lines SL described with reference to FIG. 7A, for example, bypass portions of the scan lines SL, may also be located in the first sub-intermediate area SMA1.

In the second sub-intermediate area SMA2, a much smaller number of thin films are stacked on the substrate 100 than in the first sub-intermediate area SMA1. That is, in the first sub-intermediate area SMA1, various thin films such as the gate insulating layer 203, the first and second interlayer insulating layers 205 and 207, the first and second organic insulating layers 209 and 211, the pixel defining layer 215 and the spacer 217, the first and second functional layers 222a and 222c, the opposite electrode 223, the capping layer 230, and the like, as well as the buffer layer 201, are stacked between the substrate 100 and the thin-film encapsulation layer 300. However, in an embodiment, only the buffer layer 201 is stacked between the substrate 100 and the thin-film encapsulation layer 300 in the second sub-intermediate area SMA2.

Due to the difference in the number of layers of the thin films on the substrate 100 between the first and second sub-intermediate areas SMA1 and SMA2, all layers including organic matter, which may be a path of water penetration into the display area DA with respect to the second sub-intermediate area SMA2 close to the transmission area OA, are removed. That is, since the second sub-intermediate area SMA2 is in contact with the first opening 10H of the transmission area OA, moisture may penetrate from the outside through the second sub-intermediate area SMA2. Here, layers including organic matter, such as the first functional layer 222a or the second functional layer 222c among the layers on the substrate 100, may be a path through which moisture flows, and, thus, in an embodiment, layers between the substrate 100 and the thin-film encapsulation layer 300 of the second sub-intermediate area SMA2 are removed while leaving only the buffer layer 201, which is an inorganic film. In this case, since the path through which the moisture may enter the display area DA through the transmission area OA is blocked, damage to the display area DA due to penetration may be prevented or substantially prevented.

In an embodiment, the structure from which the thin film layers of the second sub-intermediate area SMA2 are removed as described above may be implemented through a process using a sacrificial layer 500 (see FIG. 9A) and laser beam irradiation, as shown in FIGS. 9A to 9D.

Figure 9A:
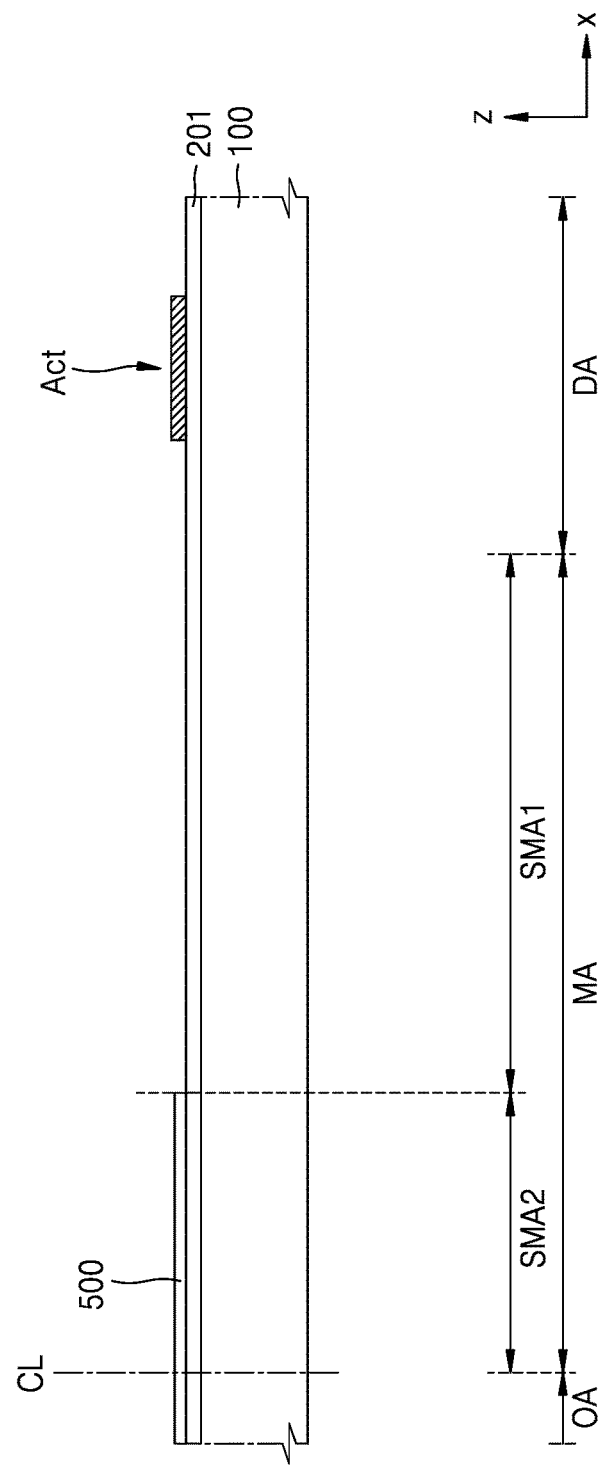
FIGS. 9A to 9D are cross-sectional views illustrating a manufacturing process of the display panel of FIG. 8.

First, as shown in FIG. 9A, the sacrificial layer 500 and the semiconductor layer Act are formed on the buffer layer 201 on the substrate 100. That is, the semiconductor layer Act is formed in the display area DA, and the sacrificial layer 500 is formed in the second sub-intermediate area SMA2 of the intermediate area MA. Here, the sacrificial layer 500 may include a material that is easily sublimed when irradiated with an infrared laser beam, for example, silver (Ag) material.

Figure 9B:
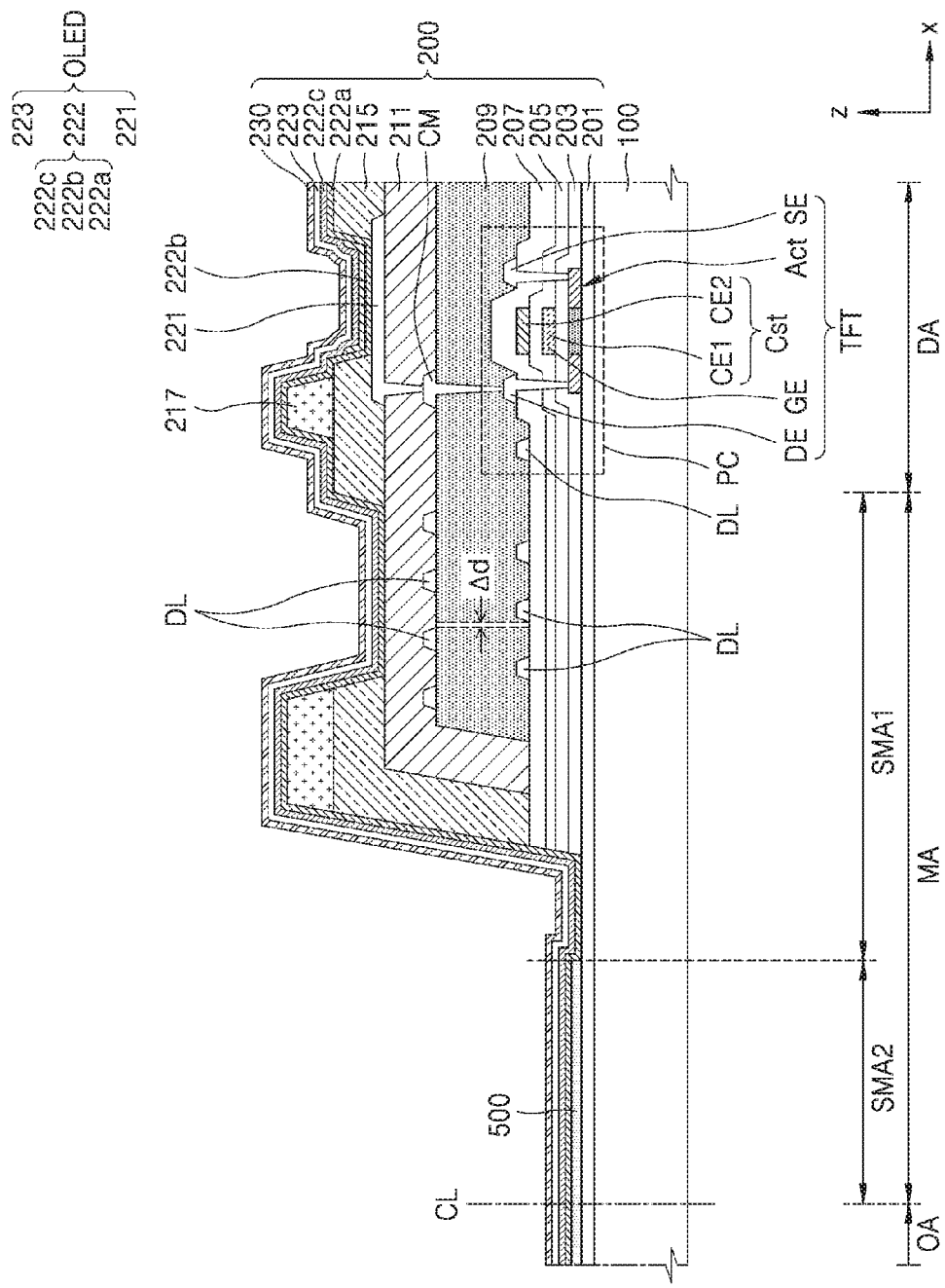

Subsequently, as illustrated in FIG. 9B, the thin-film transistor TFT, the capacitor Cst, and the organic light-emitting diode OLED are formed in the display area DA, wherein the first and second functional layers 222a and 222c, the opposite electrode 223, the capping layer 230, and the like, that are stacked in the display area DA extend to the intermediate area MA. That is, the first and second functional layers 222a and 222c, the opposite electrode 223, the capping layer 230, and the like extend to the first sub-intermediate area SMA1 and the second sub-intermediate area SMA2 on which the sacrificial layer 500 is formed.

Figure 9C:
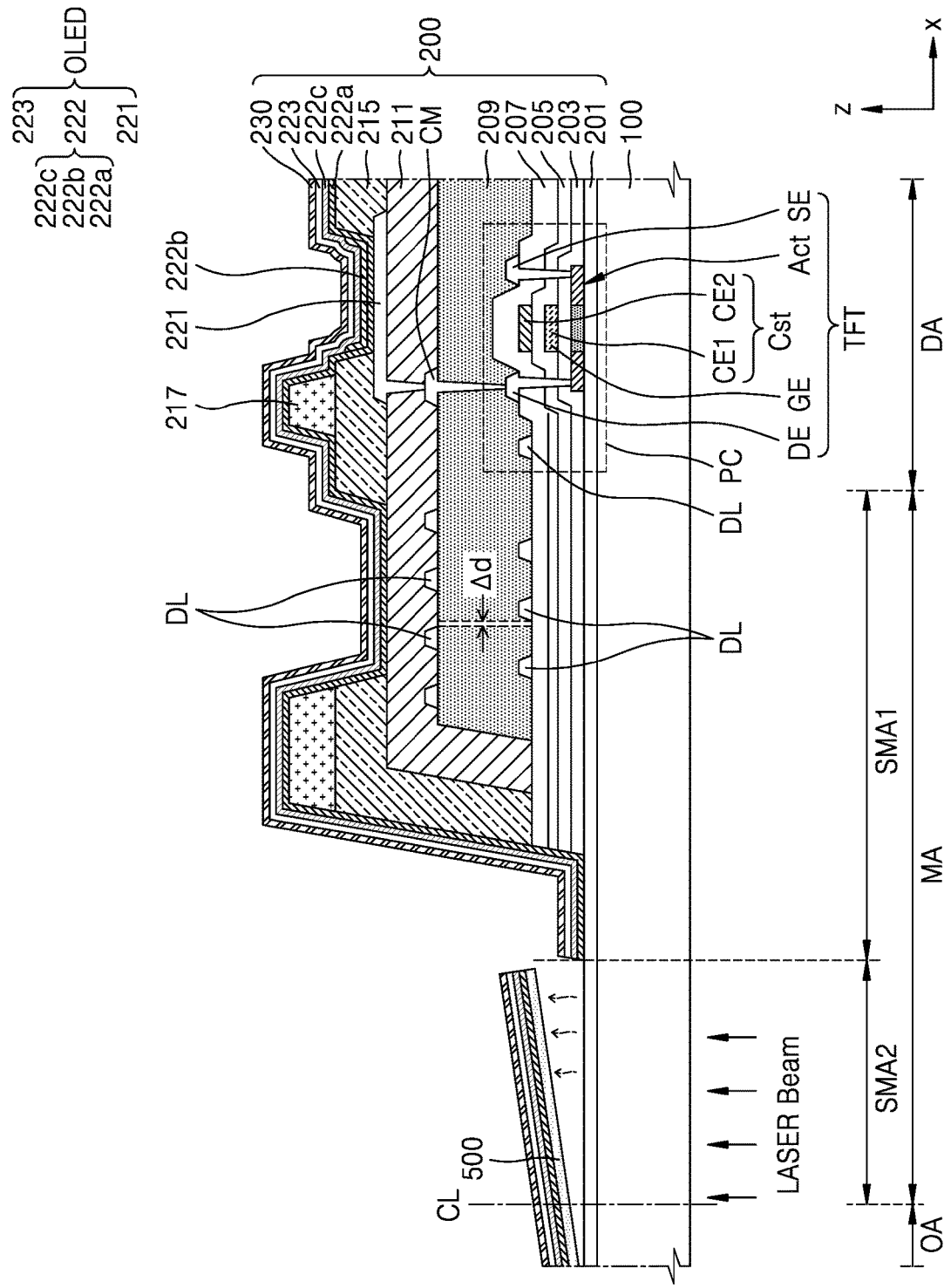

In this state, as shown in FIG. 9C, when an infrared laser beam is irradiated toward the sacrificial layer 500, the sacrificial layer 500 is sublimed away from the buffer layer 201 on the substrate 100 together with thin film layers stacked thereon.

Figure 9D:
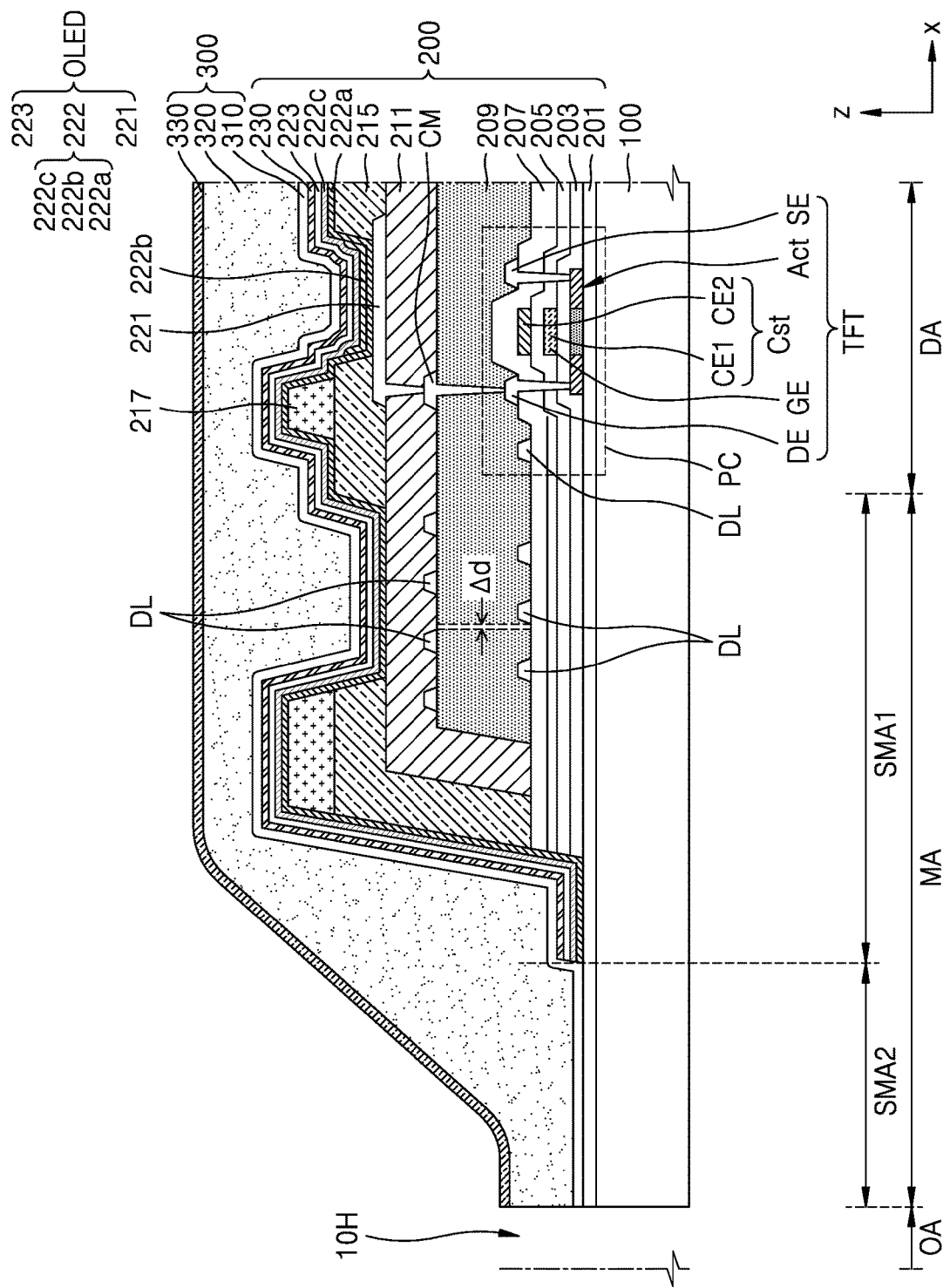

In this case, only the buffer layer 201 remains in the second sub-intermediate area SMA2, and the thin-film encapsulation layer 300 is formed thereon, as shown in FIG. 9D.

The thin-film encapsulation layer 300 covers the organic light-emitting diode OLED of the display area DA to prevent or substantially prevent the organic light-emitting diode OLED from being damaged or degraded by external impurities.

The thin-film encapsulation layer 300 may include at least one organic encapsulation layer and at least one inorganic encapsulation layer. The first inorganic encapsulation layer 310 formed by a chemical vapor deposition method may have better step coverage than the first functional layer 222a, the second functional layer 222c, and/or the opposite electrode 223 described above.

The organic encapsulation layer 320 may be formed by applying a monomer or polymer material and curing the same.

The second inorganic encapsulation layer 330 may be on the organic encapsulation layer 320.

When the first opening 10H is formed along a cutting line CL after the thin-film encapsulation layer 300 is formed, as shown in FIG. 9D, a structure having a much smaller number of layers of thin films stacked in the second sub-intermediate area SMA2 than on the first sub-intermediate area SMA1 is formed. Therefore, in an embodiment, there is no organic layer connected from an end contacting the first opening 10H of the transmission area OA to the organic light-emitting diode OLED or the thin-film transistor TFT of the display area DA. That is, all layers which may be a path of water penetration may be removed.

Therefore, such a structure may suppress a problem, such as water penetration into the display area DA from the transmission area OA, and may be implemented by a simple process of laying down the sacrificial layer 500 first and then subliming the same with a laser beam, thereby simplifying the production process. In addition, since the sacrificial layer 500 does not need to have a large size, and only needs to be made large enough to break organic film connection between the transmission area OA and the display area DA, the area of the intermediate area MA occupied on the plane, which becomes a dead space, may also be reduced.

Although the display panel 10-1 described with reference to FIGS. 8 to 9D includes the first opening 10H corresponding to the transmission area OA, in another embodiment, as described above with reference to FIGS. 3B to 3D, the display panel 10-1 may not include the first opening 10H corresponding to the transmission area OA. In this case, the first opening 10H may not be formed along the cutting line CL and may be used as the transmission area OA. For example, in an embodiment, the first opening 10H may be formed in the transmission area OA when using a device that is sensitive to transmittance, such as a camera, as the component 20. However, when using a device such as an infrared sensor, as the component 20, it is not difficult to exchange a signal with the display panel 10-1 through the transmission area OA even without forming the first opening 10H. This feature may be similarly applied to a display panel 10-2 to be described later below.

Figure 10:
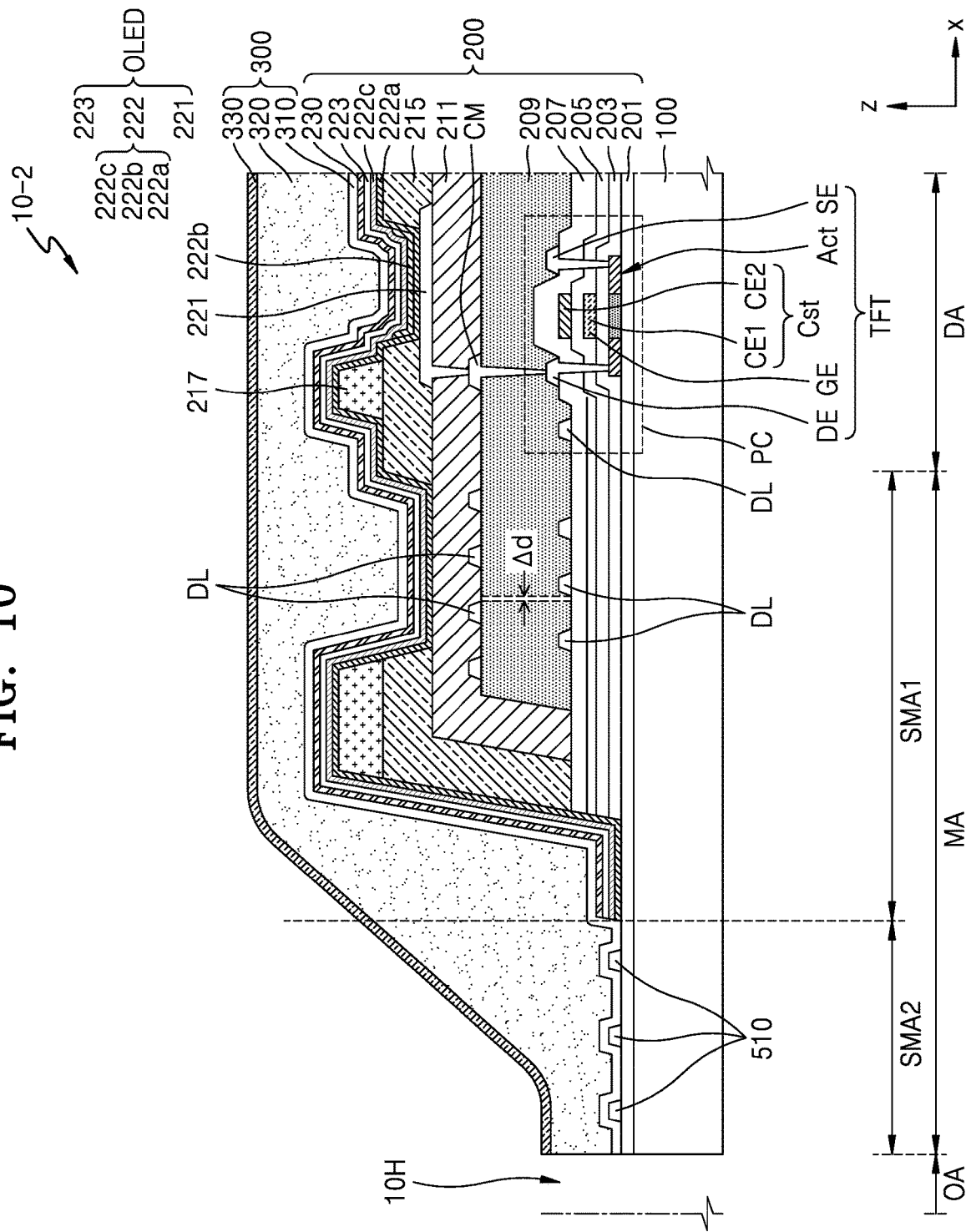
FIG. 10 is a cross-sectional view of a display panel according to another embodiment.

FIG. 10 is a cross-sectional view of the display panel 10-2 according to another embodiment.

The display panel 10-2 of FIG. 10 is basically the same as the structure described with reference to FIG. 8. That is, the display panel 10-2 has a structure in which thin films are stacked in the second sub-intermediate area SMA2 and having a much smaller number of layers than in the first sub-intermediate area SMA1. Also, the organic film between the substrate 100 and the thin-film encapsulation layer 300 of the second sub-intermediate area SMA2 is removed in the same manner as the structure described with reference to FIG. 8, such that a moisture permeation path from the transmission area OA to the display area DA does not exist.

However, the present embodiment differs in that an uneven pattern layer 510 is further provided in the second sub-intermediate area SMA2. In an embodiment, the uneven pattern layer 510 may be formed of polysilicon, which is a same material as that of forming the semiconductor layer Act of the display area DA, and may be arranged in the second sub-intermediate area SMA2 in a shape in which a plurality of protrusions and grooves are arranged. The uneven pattern layer 510 may have a structure in which a plurality of protrusions on a plane are apart from each other in an island shape, as shown in FIG. 11E, or may have a structure in which a plurality of linear protrusions intersect in a mesh shape, as shown in FIG. 11F.

The sacrificial layer 500 is formed on the uneven pattern layer 510. That is, the process of forming the uneven pattern layer 510 first on the buffer layer 201, forming the sacrificial layer 500 thereon, and then subliming the sacrificial layer 500 later is performed in the same manner as the embodiment of FIG. 8.

Because the sacrificial layer 500 is formed on the uneven pattern layer 510, a heat absorption rate of the sacrificial layer 500 is increased by first widening a surface area for an infrared laser beam. That is, since the sacrificial layer 500 is also formed in the same pattern after the uneven shape of the uneven pattern layer 510, a surface area of the sacrificial layer 500 increases compared to a flat shape without the uneven pattern layer 510. Therefore, when an infrared laser beam is irradiated, the heat absorption rate of the sacrificial layer 500 may be improved by the increased surface area. In addition, since the sacrificial layer 500 reflects the infrared laser beam less when the shape is uneven than when the shape is flat, the heat absorption rate is improved. Therefore, it is possible to sublimate the sacrificial layer 500 easily with little energy. In addition, since the sacrificial layer 500 has a wider contact area with the thin-film encapsulation layer 300 to be formed later on the uneven pattern layer 510, more satisfactory coupling with the thin-film encapsulation layer 300 may be ensured. In addition, even if moisture were to penetrate from an end portion of the second sub-intermediate area SMA2 that is in contact with the transmission area OA, a moisture permeation path is long due to the uneven pattern layer 510, such that penetration is less likely.

Therefore, when the uneven pattern layer 510 is formed, sublimation of the sacrificial layer 500 may be easily performed, and it is possible to further obtain an effect such as ensuring of tighter coupling with the thin-film encapsulation layer 300.

In an embodiment, the display panel 10-2 of FIG. 10 may be manufactured through processes of FIGS. 11A to 11D.

Figure 11A:
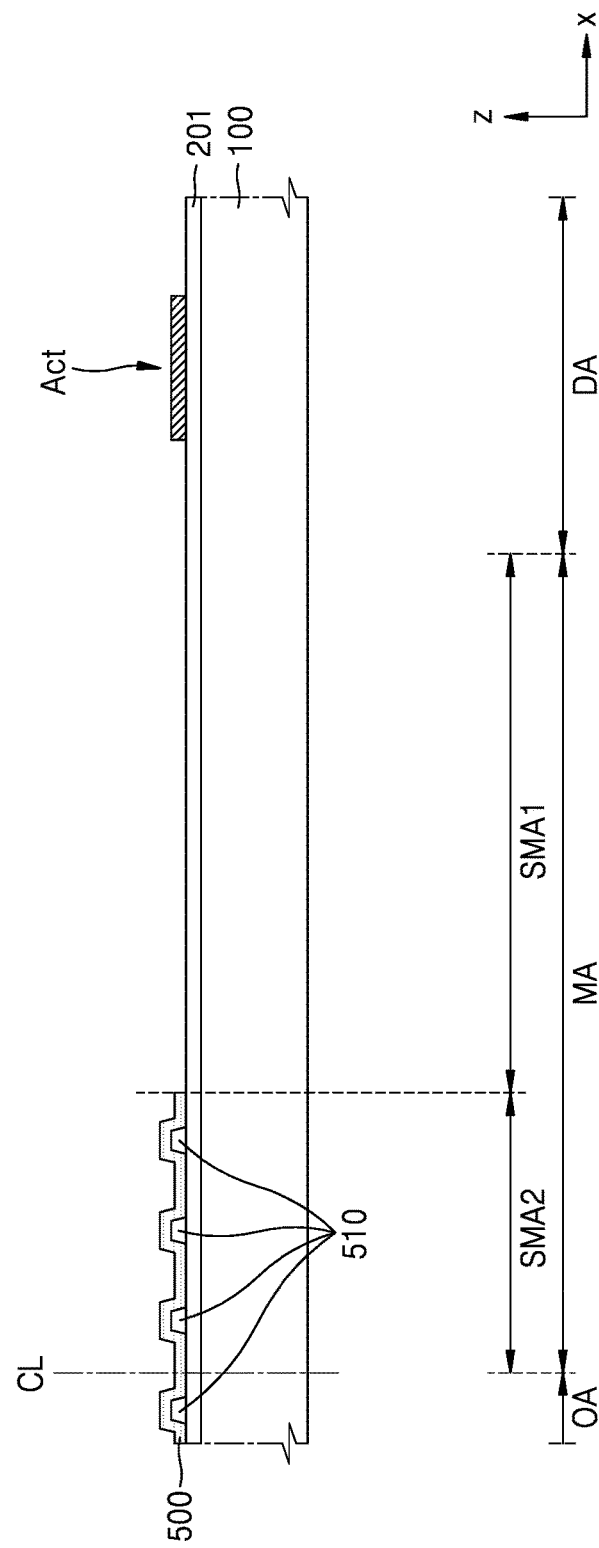
FIGS. 11A to 11D are cross-sectional views illustrating a manufacturing process of the display panel of FIG. 10.

First, in an embodiment, as shown in FIG. 11A, both the uneven pattern layer 510 and the semiconductor layer Act include the same material (e.g., polysilicon) on the buffer layer 201 on the substrate 100. That is, the semiconductor layer Act of polysilicon is formed in the display area DA, and the uneven pattern layer 510 of the same polysilicon material is also formed in the second sub-intermediate area SMA2 of the intermediate area MA. The sacrificial layer 500 is formed on the uneven pattern layer 510. Here, the sacrificial layer 500 is also formed with a larger surface area along the uneven shape of the uneven pattern layer 510. The uneven pattern layer 510 may be formed in a regular taper shape, that is, a trapezoidal shape that becomes narrower from bottom to top such that the sacrificial layer 500 is formed well without being cut thereon.

Figure 11B:
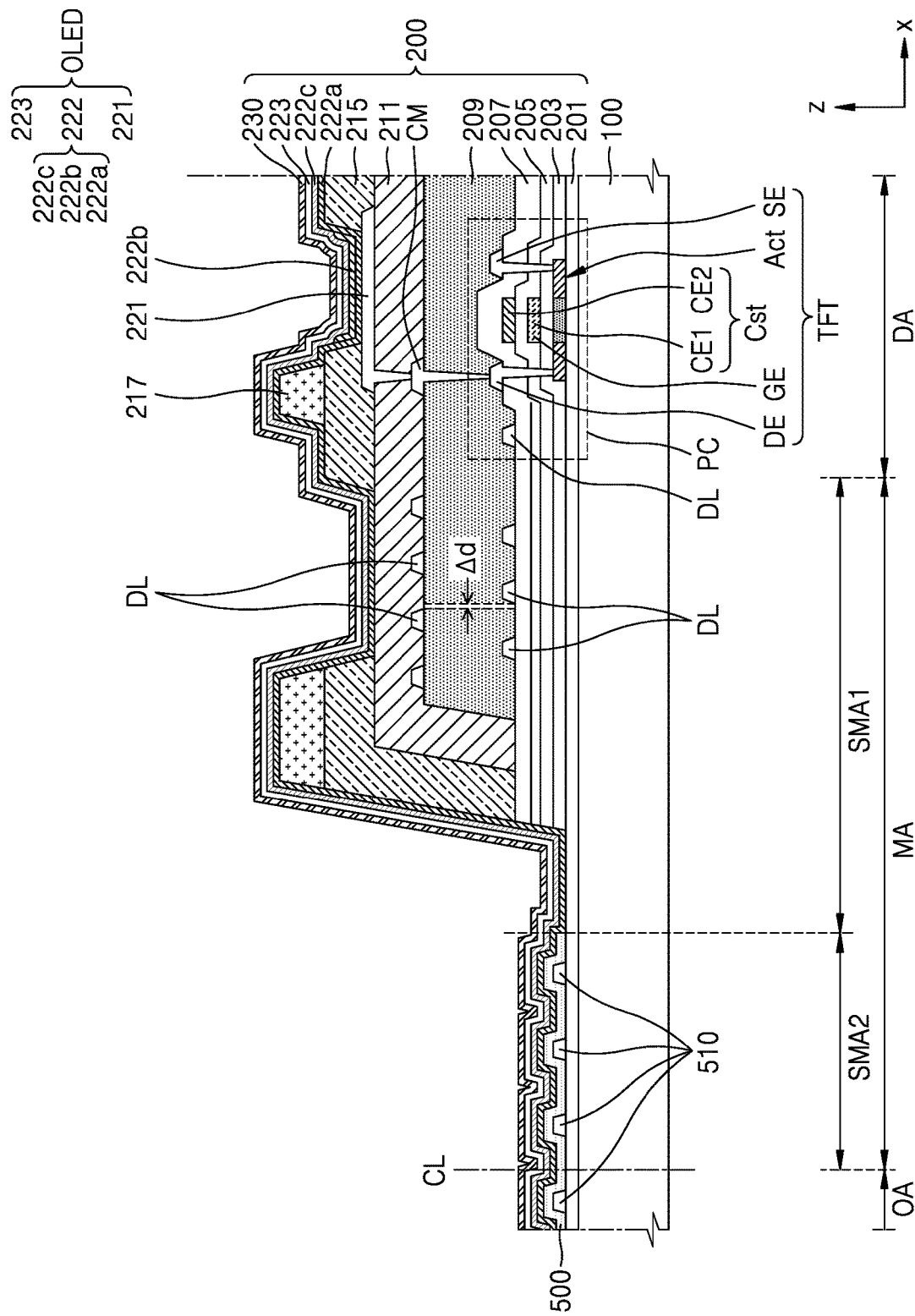

Subsequently, as illustrated in FIG. 11B, the thin-film transistor TFT, the capacitor Cst, and the organic light-emitting diode OLED are formed in the display area DA, wherein the first and second functional layers 222a and 222c, the opposite electrode 223, the capping layer 230, and the like, stacked in the display area DA extend to the intermediate area MA. That is, the first and second functional layers 222a and 222c, the opposite electrode 223, the capping layer 230, and the like, extend to the first sub-intermediate area SMA1 and the second sub-intermediate area SMA2 on which the uneven pattern layer 510 and the sacrificial layer 500 are formed.

Figure 11C:
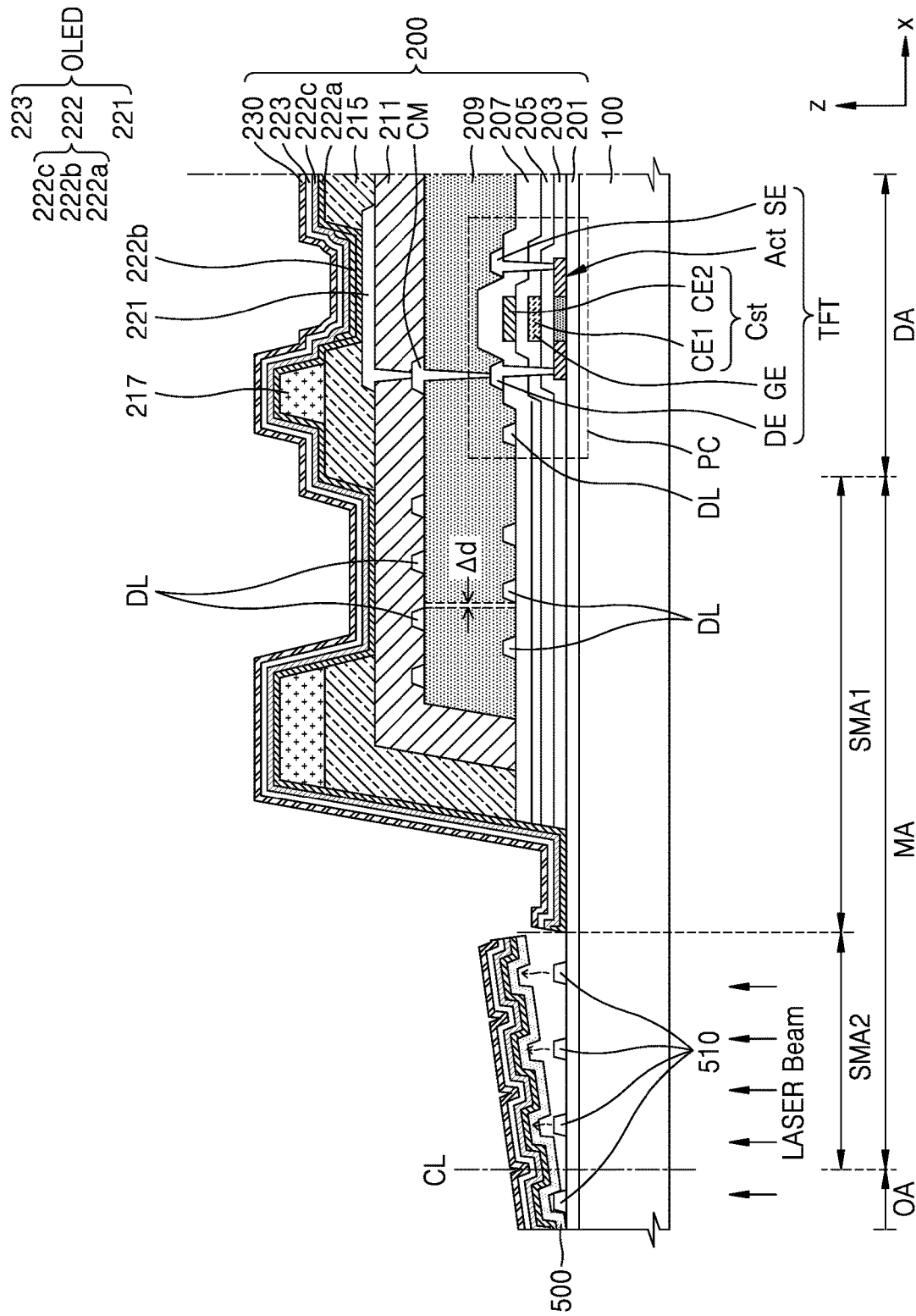

In this state, as shown in FIG. 11C, when an infrared laser beam is irradiated toward the sacrificial layer 500, the sacrificial layer 500 with a larger surface area is separated from the uneven pattern layer 510 together with thin film layers stacked thereon as the sacrificial layer 500 is rapidly sublimated.

Figure 11D:
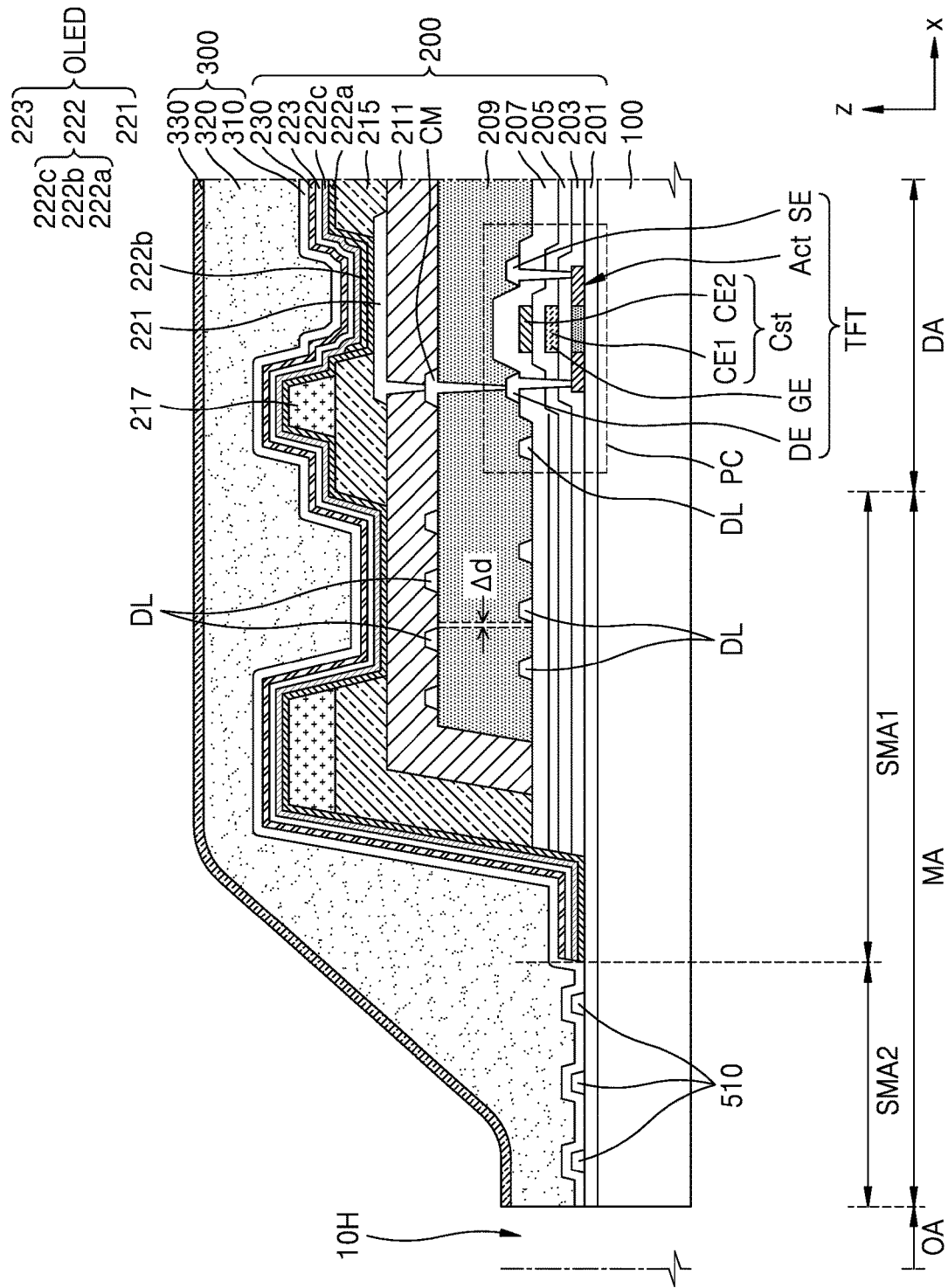
Figure 11E:
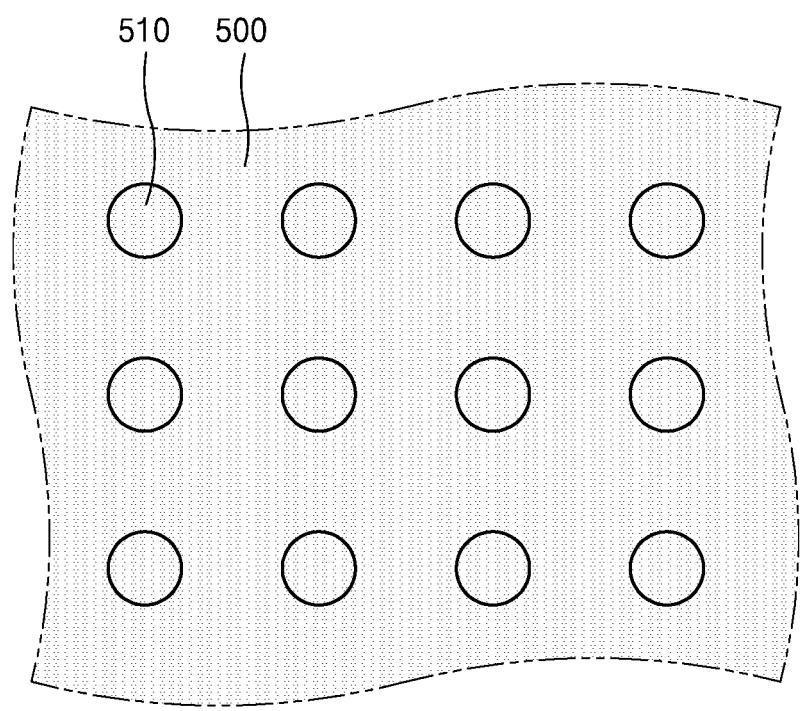
FIGS. 11E and 11F are plan views of examples of a deformable planar shape of an uneven pattern layer of FIG. 10.
Figure 11F:
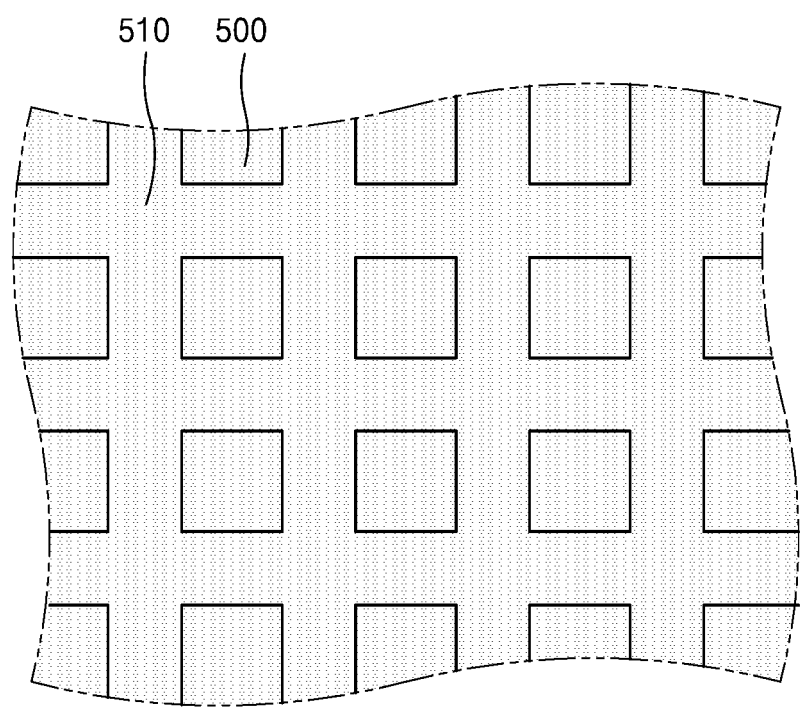

In this case, only the buffer layer 201 and the uneven pattern layer 510 remain in the second sub-intermediate area SMA2, and the thin-film encapsulation layer 300 including the first inorganic encapsulation layer 310, the organic encapsulation layer 320, and the second inorganic encapsulation layer 330 is formed thereon, as shown in FIG. 11D.

When the first opening 10H is formed along the cutting line CL after the thin-film encapsulation layer 300 is formed, as shown in FIG. 11D, a structure having a much smaller number of layers of thin films stacked in the second sub-intermediate area SMA2 than in the first sub-intermediate area SMA1 is formed. Therefore, there is no organic layer connected from the end contacting the first opening 10H of the transmission area OA to the organic light-emitting diode OLED or the thin-film transistor TFT of the display area DA. That is, all the layers which may be a path of water penetration are removed.

Therefore, such a structure may suppress a problem such as water penetration into the display area DA from the transmission area OA, and may be implemented by a simple process of forming the uneven pattern layer 510 and the sacrificial layer 500 and then subliming the sacrificial layer 500 with a laser beam, thereby simplifying the production process. In addition, since the sacrificial layer 500 does not need to have a large size, and only needs to be made large enough to break organic film connection between the transmission area OA and the display area DA, the area of the intermediate area MA occupied on the plane, which becomes a dead space, may also be reduced. In addition, the surface area absorbing heat of the sacrificial layer 500 is widened by the uneven pattern layer 510 such that the sublimation operation may be easily performed, even with a small amount of energy. Also, cohesion force of the thin-film encapsulation layer 300 and the second sub-intermediate area SMA2 increases, which ensures a tighter sealing function.

In an embodiment, the uneven pattern layer 510 is formed of the same polysilicon material as that of the semiconductor layer Act, but embodiments are not limited thereto. For example, the uneven pattern layer 510 may be formed of a material such as SiON, $SiO_2$, or $SiN_x$.

The embodiments of FIGS. 8 and 10 respectively illustrate the display panels 10-1 and 10-2 in which layers up to the thin-film encapsulation layer 300 are formed on the substrate 100. The input sensing layer 40 may be formed on the display panels 10-1 and 10-2 by a subsequent process.

Figure 12:
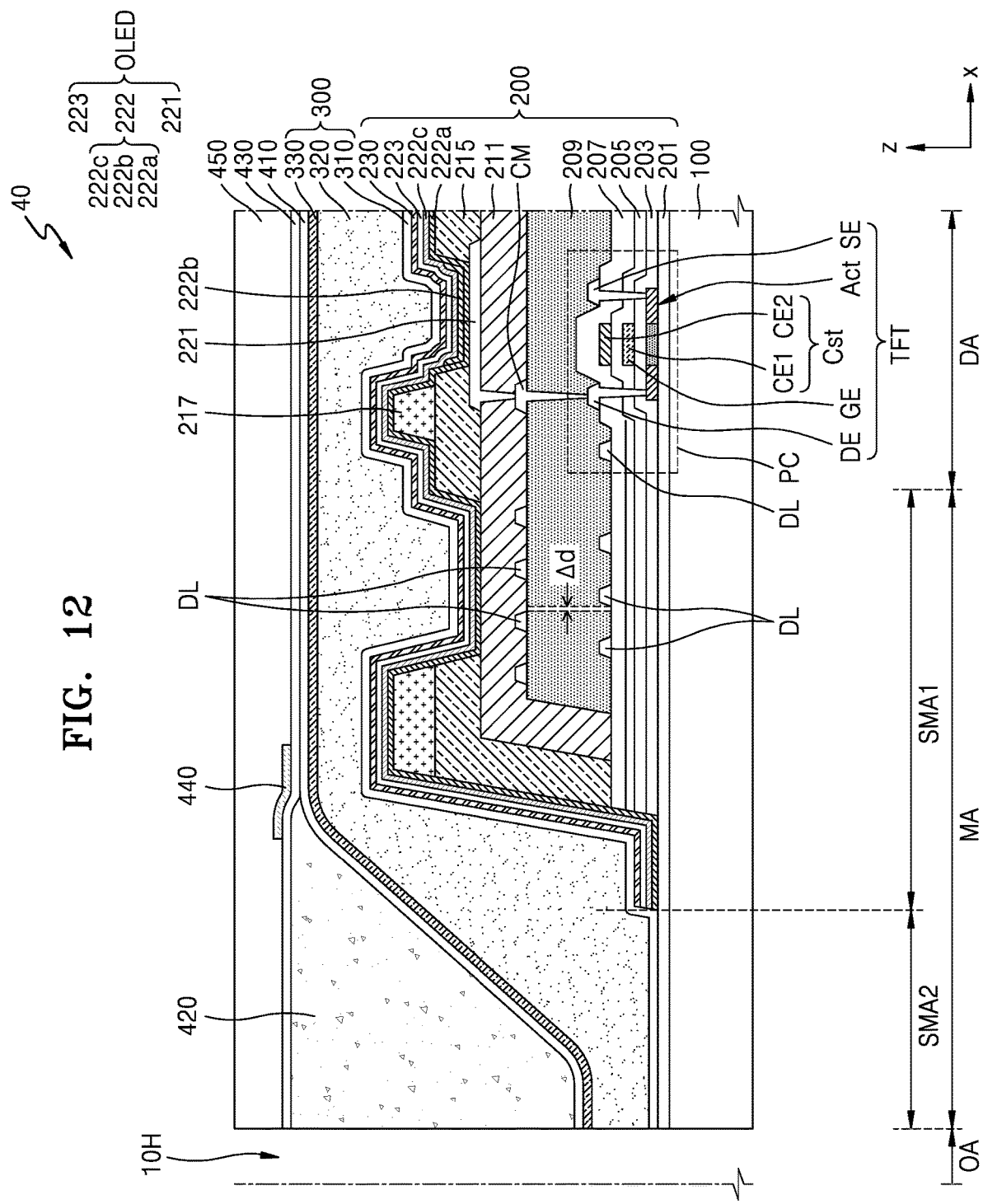
FIG. 12 is a cross-sectional view of a structure in which an input sensing layer is provided on the display panel of FIG. 8.
Figure 13:
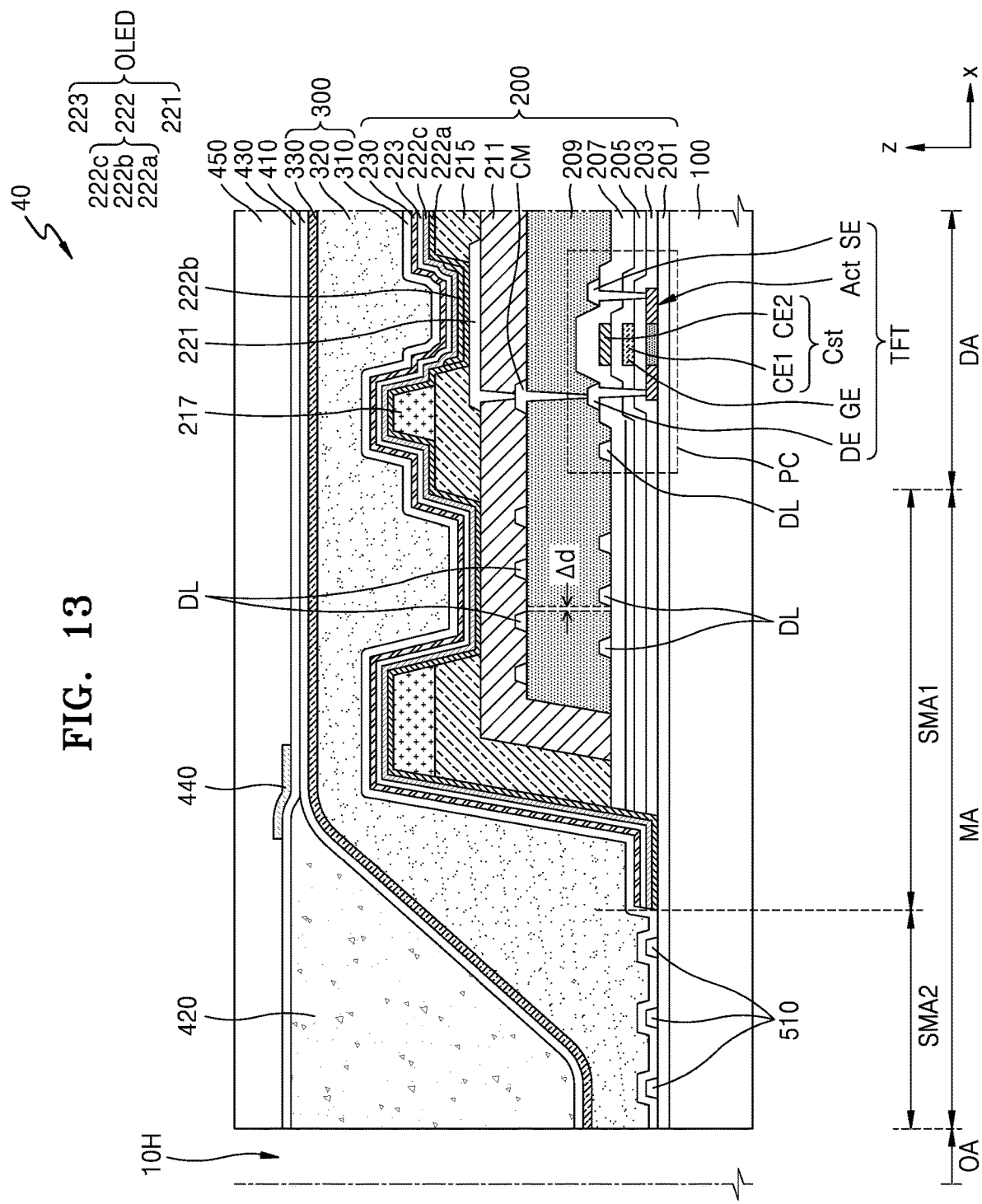
FIG. 13 is a cross-sectional view of a structure in which an input sensing layer is provided on the display panel of FIG. 10.

FIG. 12 illustrates a structure in which the input sensing layer 40 is formed on the display panel 10-1 of FIG. 8; and FIG. 13 illustrates a structure in which the input sensing layer 40 is formed on the display panel 10-2 of FIG. 10. Since the structure of the input sensing layer 40 is the same in FIGS. 12 and 13, it will be described with reference to FIG. 12.

First, a planarization layer 420 is arranged on the thin-film encapsulation layer 300. The planarization layer 420 may be an organic insulating layer. The planarization layer 420 may include a polymer-based material. For example, the planarization layer 420 may include a silicone resin, an acrylic resin, an epoxy resin, polyimide, polyethylene, or the like. In an embodiment, the planarization layer 420 may include a material different from that of the organic encapsulation layer 320.

The planarization layer 420 increases flatness of the display panel 10-1 around the transmission area OA by covering a step between the first sub-intermediate area SMA1 and the second sub-intermediate area SMA2.

First and second insulating layers 410 and 430 are arranged on lower and upper portions, respectively, of the planarization layer 420. In an embodiment, the first insulating layer 410 and the second insulating layer 430 may include an inorganic insulating material, such as silicon oxide, silicon nitride, or silicon oxynitride. Each of the first insulating layer 410 and the second insulating layer 430 may include a single layer or multiple layers including the above materials.

In an embodiment, a cover layer 440 covers a step between an end of the planarization layer 420 and an upper surface of the first insulating layer 410 to prevent or substantially prevent the film from being lifted or separated. In an embodiment, the cover layer 440 may include metal. While each of the first insulating layer 410, the second insulating layer 430, and a third insulating layer 450, which will be described later below, extends in the display area DA as well as the intermediate area MA, the cover layer 440 has a certain width and covers the end of the planarization layer 420.

The third insulating layer 450 may be on the cover layer 440. The third insulating layer 450 may include an organic insulating material. For example, the organic insulating material of the third insulating layer 450 may include a photoresist (negative or positive) or a polymer-based organic material, and may extend toward the display area DA to cover the display area DA.

Here, the upper portion of the second insulating layer 430 may correspond to the above-described input sensing layer 40. In the input sensing layer 40, an electrode (not shown) for detecting a user's touch is arranged between the second insulating layer 430 and the third insulating layer 450 to perform a function of a touch screen that transmits a signal to the display panel 10.

As described above, according to embodiments, problems such as moisture penetration into the display area DA from the transmission area OA may be suppressed through a simple process of laying down the sacrificial layer 500 first and then subliming the same with a laser beam. In addition, since the sacrificial layer 500 does not need to have a large size, and only needs to be made large enough to break organic film connection between the transmission area OA and the display area DA, the area of the intermediate area MA occupied on the plane, which becomes a dead space, may also be reduced.

According to a display apparatus and a manufacturing method thereof according to one or more embodiments, an intermediate area surrounding a transmission area may be formed very narrow through a simple process, and, thus, a dead space around the transmission area may be effectively reduced. However, the aspects and effects described above are illustrative, and aspects and effects according to embodiments are not limited thereto.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
a display area and a transmission area on a substrate, and an intermediate area arranged between the display area and the transmission area and comprising a first sub-intermediate area and a second sub-intermediate area between the first sub-intermediate area and the transmission area,
wherein the display area comprises a display element comprising a pixel electrode, an opposite electrode opposite the pixel electrode, and an intermediate layer between the pixel electrode and the opposite electrode, and
wherein a number of layers of thin films stacked on the substrate among the pixel electrode, the opposite electrode, and the intermediate layer in the first sub-intermediate area is different from a number of layers of thin films stacked on the substrate among the pixel electrode, the opposite electrode, and the intermediate layer in the second sub-intermediate area.

2. The display apparatus of claim 1, wherein the number of layers of thin films stacked on the substrate among the pixel electrode, the opposite electrode, and the intermediate layer in the second sub-intermediate area is less than the number of layers of thin films stacked on the substrate among the pixel electrode, the opposite electrode, and the intermediate layer in the first sub-intermediate area.

3. The display apparatus of claim 1, further comprising an uneven pattern layer comprising a plurality of protrusions and grooves arranged on the substrate in the second sub-intermediate area.

4. The display apparatus of claim 3, wherein the uneven pattern layer comprises polysilicon.

5. The display apparatus of claim 3, wherein the uneven pattern layer comprises any of SiON, $SiO_2$, and $SiN_x$.

6. The display apparatus of claim 3, wherein the uneven pattern layer comprises a plurality of protrusions arranged apart from each other in an island shape.

7. The display apparatus of claim 3, wherein the uneven pattern layer comprises a plurality of linear protrusions arranged to intersect in a mesh shape.

8. The display apparatus of claim 1, further comprising a component in communication with an optical signal and/or an acoustic signal through the transmission area.

9. A display apparatus comprising:
a display area and a transmission area on a substrate, and an intermediate area arranged between the display area and the transmission area and comprising a first sub-intermediate area and a second sub-intermediate area between the first sub-intermediate area and the transmission area; and
an uneven pattern layer comprising a plurality of protrusions and grooves arranged on the substrate in the second sub-intermediate area,
wherein a number of layers of thin films stacked on the substrate in the first sub-intermediate area is different from a number of layers of thin films stacked on the substrate in the second sub-intermediate area,
wherein the display area comprises a thin-film transistor comprising a semiconductor layer, a gate electrode, a source electrode, and a drain electrode, and
the uneven pattern layer comprises a same material and is arranged on a same layer as the semiconductor layer.

10. The display apparatus of claim 9, wherein the display area further comprises a display element comprising a pixel electrode connected to the thin-film transistor, an opposite electrode opposite the pixel electrode, and an intermediate layer between the pixel electrode and the opposite electrode.

11. A manufacturing method of a display apparatus, the manufacturing method comprising:
    forming a display area on a substrate;
    forming a transmission area on the substrate; and
    forming an intermediate area between the display area and the transmission area, the intermediate area comprising a first sub-intermediate area and a second sub-intermediate area between the first sub-intermediate area and the transmission area,
    wherein the forming of the display layer comprises forming a display element comprising a pixel electrode connected to the thin-film transistor, an opposite electrode opposite the pixel electrode, and an intermediate layer between the pixel electrode and the opposite electrode, and
    wherein, in the forming of the intermediate area, a number of layers of thin films stacked on the substrate among the pixel electrode, the opposite electrode, and the intermediate layer in the first sub-intermediate area is different from a number of layers of thin films stacked on the substrate among the pixel electrode, the opposite electrode, and the intermediate layer in the second sub-intermediate area.

12. The manufacturing method of claim 11, wherein the number of layers of thin films stacked on the substrate among the pixel electrode, the opposite electrode, and the intermediate layer in the second sub-intermediate area is less than the number of layers of thin films stacked on the substrate among the pixel electrode, the opposite electrode, and the intermediate layer in the first sub-intermediate area.

13. The manufacturing method of claim 11, further comprising:
    forming a sacrificial layer on the substrate in the second sub-intermediate area;
    forming a thin film layer on the sacrificial layer over the first sub-intermediate area and the second sub-intermediate area; and
    irradiating a laser beam to the second sub-intermediate area to remove the sacrificial layer and a thin film layer stacked on the sacrificial layer.

14. The manufacturing method of claim 13, further comprising:
    forming an uneven pattern layer in which a plurality of protrusions and grooves is arranged in the second sub-intermediate area,
    wherein the sacrificial layer is formed on the uneven pattern layer such that the uneven pattern layer remains after the sacrificial layer and the thin film layer stacked on the sacrificial layer are removed.

15. The manufacturing method of claim 14, wherein the uneven pattern layer comprises any of polysilicon, SiON, $SiO_2$, and $SiN_x$.

16. The manufacturing method of claim 14, wherein the forming of the display area further comprises forming a thin-film transistor comprising a semiconductor layer, a gate electrode, a source electrode, and a drain electrode on the substrate, and
    the uneven pattern layer comprises a same material and is arranged in a same layer as the semiconductor layer.

17. The manufacturing method of claim 16, wherein the forming of the display layer comprises forming the display element comprising the pixel electrode connected to the thin-film transistor.

18. The manufacturing method of claim 14, wherein the uneven pattern layer is formed in a shape in which a plurality of protrusions are arranged apart from each other in an island shape.

19. The manufacturing method of claim 14, wherein the uneven pattern layer is formed in a mesh shape in which a plurality of linear protrusions intersect each other.

20. The manufacturing method of claim 11, further comprising arranging a component in communication with an optical signal and/or an acoustic signal through the transmission area.

* * * * *